United States Patent
Nakagawa et al.

(10) Patent No.: US 11,186,672 B2
(45) Date of Patent: Nov. 30, 2021

(54) POLYMER, COMPOSITION, COATING FILM, LAYERED PRODUCT, BACK SHEET, AND SOLAR CELL MODULE

(71) Applicant: DAIKIN INDUSTRIES, LTD., Osaka (JP)

(72) Inventors: Hideto Nakagawa, Osaka (JP); Kengo Ito, Osaka (JP); Kenji Gobou, Osaka (JP); Koichiro Ogita, Osaka (JP); Katsuhiko Imoto, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 91 days.

(21) Appl. No.: 16/083,261

(22) PCT Filed: Mar. 9, 2017

(86) PCT No.: PCT/JP2017/009442
§ 371 (c)(1),
(2) Date: Sep. 7, 2018

(87) PCT Pub. No.: WO2017/155022
PCT Pub. Date: Sep. 14, 2017

(65) Prior Publication Data
US 2019/0016848 A1 Jan. 17, 2019

(30) Foreign Application Priority Data
Mar. 10, 2016 (JP) .............. JP2016-047432

(51) Int. Cl.
*C08G 18/62* (2006.01)
*C08G 18/10* (2006.01)
(Continued)

(52) U.S. Cl.
CPC .......... *C08G 18/6279* (2013.01); *B32B 27/30* (2013.01); *C08F 214/267* (2013.01);
(Continued)

(58) Field of Classification Search
CPC ............ B32B 17/10798; B32B 27/283; B32B 15/092; B32B 9/045; B32B 17/10018;
(Continued)

(56) References Cited

U.S. PATENT DOCUMENTS

| 2009/0239993 | A1 | 9/2009 | Sumi et al. |
| 2011/0083726 | A1 | 4/2011 | Takayanagi et al. |
| 2015/0318423 | A1* | 11/2015 | Vangaever ................. C08J 7/04 136/256 |

FOREIGN PATENT DOCUMENTS

| CN | 1467230 A | 1/2004 |
| EP | 1 938 967 A1 | 7/2008 |

(Continued)

OTHER PUBLICATIONS

International Preliminary Report on Patentability for International Application No. PCT/JP2017/009442, dated Sep. 11, 2018.
(Continued)

*Primary Examiner* — Samir Shah
(74) *Attorney, Agent, or Firm* — Sughrue Mion, PLLC (57) ABSTRACT

Provided is a polymer capable of providing a coating film that has good initial adhesiveness to a base material and good adhesiveness thereto after a pressure cooker test, and has excellent abrasion resistance as determined by a falling sand abrasion test. The polymer includes a perhaloolefin unit, a vinyl ester unit that contains neither a hydroxy group nor an aromatic ring; and a hydroxy group-containing monomer unit. The polymer has a hydroxyl value of 110 mgKOH/g or greater.

9 Claims, 1 Drawing Sheet

(51) Int. Cl.
  *H01L 31/049* (2014.01)
  *B32B 27/30* (2006.01)
  *C08G 18/80* (2006.01)
  *C08G 18/79* (2006.01)
  *C08G 18/70* (2006.01)
  *C09D 175/04* (2006.01)
  *C09D 127/12* (2006.01)
  *C08G 18/78* (2006.01)
  *C08F 214/26* (2006.01)

(52) U.S. Cl.
  CPC .......... *C08G 18/10* (2013.01); *C08G 18/706* (2013.01); *C08G 18/7831* (2013.01); *C08G 18/792* (2013.01); *C08G 18/807* (2013.01); *C08G 18/8025* (2013.01); *C08G 18/8029* (2013.01); *C08G 18/8064* (2013.01); *C08G 18/8074* (2013.01); *C08G 18/8077* (2013.01); *C08G 18/8093* (2013.01); *C09D 127/12* (2013.01); *C09D 175/04* (2013.01); *H01L 31/049* (2014.12); *C08L 2203/204* (2013.01); *Y02E 10/50* (2013.01)

(58) Field of Classification Search
  CPC .......... B32B 27/08; B32B 7/12; B32B 15/20; B32B 27/42; B32B 27/30; B32B 15/08; B32B 15/18; B32B 27/304; B32B 27/322; B32B 15/082; B32B 9/005; B32B 17/10743; B32B 17/10761; B32B 27/16; B32B 17/10733; B32B 27/285; B32B 27/281; B32B 27/36; B32B 27/365; B32B 17/10788; B32B 27/38; B32B 27/286; B32B 27/306; B32B 27/308; B32B 2255/10; B32B 2307/41; B32B 2255/26; B32B 2457/12; B32B 2255/28; B32B 2307/206; B32B 2307/712; B32B 2307/714; B32B 2250/03; B32B 2255/205; B32B 2307/546; B32B 2307/7246; B32B 2307/732; B32B 2270/00; B32B 2307/554; B32B 2255/20; B32B 2307/7265; C08G 18/8077; C08G 18/10; C08G 18/7831; C08G 18/8064; C08G 18/6279; C08G 18/792; C08G 18/807; C08G 18/8074; C08G 18/706; C08G 18/8025; C08G 18/8029; C08G 18/8093; C09D 175/04; C09D 127/12; H01L 31/049; C08F 214/267; C08K 5/29; Y02E 10/50; C08L 2203/204

See application file for complete search history.

(56) References Cited

FOREIGN PATENT DOCUMENTS

| | | |
|---|---|---|
| JP | 03-167213 A | 7/1991 |
| JP | 5-51556 A | 3/1993 |
| JP | 5-111669 A | 5/1993 |
| JP | 06-184243 A | 7/1994 |
| JP | 09-302271 A | 11/1997 |
| JP | 2002-317142 A | 10/2002 |
| JP | 2004-204205 A | 7/2004 |
| JP | 2007-035694 A | 2/2007 |
| JP | 2009-144173 A | 7/2009 |
| JP | 2011-144254 A | 7/2011 |
| JP | 2011-208043 A | 10/2011 |
| WO | 2008/035779 A1 | 3/2008 |
| WO | 2009/157449 A1 | 12/2009 |

OTHER PUBLICATIONS

Machine translation of JP 2011-144254 published Jul. 28, 2011.
Machine translation of JP 2002-317142 published Oct. 31, 2002.
Machine translation of JP 03-167213 published Jul. 19, 1991.
Machine translation of JP 2004-204205 published Jul. 22, 2004.
Machine translation of JP 2009-144173 published Jul. 2, 2009.
Machine translation of JP 2011-208043 published Oct. 20, 2011.
Machine translation of JP 09-302271 published Nov. 25, 1997.
International Search Report for PCT/JP2017/009442 dated May 16, 2017.

* cited by examiner

POLYMER, COMPOSITION, COATING FILM, LAYERED PRODUCT, BACK SHEET, AND SOLAR CELL MODULE

CROSS REFERENCE TO RELATED APPLICATIONS

This application is a National Stage of International Application No. PCT/JP2017/009442 filed Mar. 9, 2017, claiming priority based on Japanese Patent Application No. 2016-047432 filed Mar. 10, 2016.

TECHNICAL FIELD

The invention relates to polymers, compositions, coating films, laminates, back sheets, and solar cell modules.

BACKGROUND ART

Fluorocopolymers soluble in organic solvents or water and crosslinkable at room temperature have a high bond energy of a C—F bond in a molecule and low polarizability and thus have excellent properties such as weather resistance, chemical resistance, water and oil repellency, and stain resistance, and are used for various applications.

For example, Patent Literature 1 discloses a fluorocopolymer including (A) 30 to 60 mol % tetrafluoroethylene and/or hexafluoropropylene unit(s), (B) 10 to 35 mol % vinyl benzoate and/or vinyl p-t-butylbenzoate unit(s), and (C) 10 to 40 mol % a unit of a monomer having a functional group, as a fluorocopolymer capable of providing a cured coating film having excellent stain resistance.

Patent Literature 2 discloses a fluorocopolymer including (a) a tetrafluoroethylene constitutional unit, (b) a constitutional unit of a non-aromatic vinyl ester monomer free from a hydroxy group and a carboxy group, (c) a constitutional unit of a hydroxy group-containing vinyl monomer free from an aromatic group and a carboxy group, and (f) a constitutional unit of another monomer, wherein the unit (a) is present at not less than 20 mol % and not more than 49 mol %, the unit (b) is present at not less than 25 mol % and not more than 69.9 mol %, the unit (c) is present at not less than 8 mol % and not more than 30 mol %, and the unit (f) is present at not less than 0 mol % or not more than 10 mol %.

Patent Literature 3 discloses a fluorocopolymer including a repeating unit (1) of a fluoroolefin, a repeating unit (2) of a vinyl monomer or an allyl monomer, a repeating unit (3) of a vinyl monomer having a hydroxy group bonded thereto or of an allyl monomer having a hydroxy group bonded thereto, and a repeating unit (4) of a vinyl monomer having a carboxylate group bonded thereto or of an allyl monomer having a carboxylate group bonded thereto, wherein the proportion of the repeating unit (4) is from 0.4 mol % to less than 4 mol % based on the total repeating units.

In addition, a technique is known in which a fluorocopolymer soluble in organic solvents or water and crosslinkable at room temperature is used for a back sheet of a solar cell module.

For example, Patent Literature 4 discloses a back sheet for a solar cell module, including a water-impermeable sheet and, on at least one side of the water-impermeable sheet, a cured coating film formed from a fluoropolymer coating containing a curable functional group.

Patent Literature 5 discloses a back sheet for a solar cell module, including a base material sheet and, on one or both sides of the base material sheet, a cured coating film layer formed from a coating containing a fluoropolymer (A), wherein the fluoropolymer contains a repeating unit based on a fluoroolefin (a), a repeating unit based on a crosslinkable group-containing monomer (b), and a repeating unit based on an alkyl group-containing monomer (c) in which a C2-C20 linear or branched alkyl group free from a quaternary carbon atom and a polymeric able unsaturated group are linked via an ether bond or an ester bond.

CITATION LIST

Patent Literature

Patent Literature 1: JP H06-184243 A
Patent Literature 2: JP 2004-204205 A
Patent Literature 3: WO 2008/035779
Patent Literature 4: JP 2007-35694 A
Patent Literature 5: WO 2009/157449

SUMMARY OF INVENTION

Technical Problem

However, conventional coating films containing polymers are less resistant to abrasion produced by falling sand and have room for improvement in abrasion resistance.

In consideration of the above state of the art, the invention aims to provide a polymer capable of providing a coating film that has good initial adhesiveness to a base material and good adhesiveness thereto after a pressure cooker test, and has excellent abrasion resistance as determined by a falling sand abrasion test.

The invention also aims to provide a composition capable of providing a coating film that has good initial adhesiveness to a base material and good adhesiveness thereto after a pressure cooker test, and has excellent abrasion resistance as determined by a failing sand abrasion test.

The invention also aims to provide a coating film that has good initial adhesiveness to a base material and good adhesiveness thereto after a pressure cooker test, and has excellent abrasion resistance as determined by a falling sand abrasion test; and to provide a back sheet and a solar cell module each including the coating film.

The invention also aims to provide a laminate that has excellent abrasion resistance, excellent initial adhesiveness, and good adhesiveness after a pressure cooker test, and reduces cracking during roll processing owing to an increased strength of the coating film with a high crosslink density; and to provide a back sheet and a solar cell module each including the laminate.

Solution to Problem

The invention relates to a polymer (hereinafter, also referred to as "polymer (A)") including:
a unit of a perhaloolefin,
a unit of a vinyl ester that contains neither a hydroxy group nor an aromatic ring; and
a hydroxy group-containing monomer unit,
the polymer having a hydroxyl value of 110 mgKOH/g or greater.

Preferably, the perhaloolefin is at least one selected from the group consisting of tetrafluoroethylene, chlorotrifluoroethylene, and hexafluoropropylene.

Preferably, the vinyl ester is at least one selected from the group consisting of vinyl acetate, vinyl propionate, vinyl butyrate, vinyl isobutyrate, vinyl pivalate, vinyl caproate, vinyl versatate, vinyl laurate, vinyl stearate, and vinyl cyclohexylcarboxylate.

Preferably, the hydroxy group-containing monomer is a hydroxyalkyl vinyl ether.

The invention relates to a composition including a polymer (hereinafter, also referred to as "polymer B") and a polyisocyanate compound,
the polymer including:
a unit of a perhaloolefin; and
a hydroxy group-containing monomer unit,
the polymer having a hydroxyl value of 90 mgKOH/g or greater,
the composition having an equivalent ratio between an isocyanate group of the polyisocyanate compound and a hydroxy group of the polymer of smaller than 1.0.

Preferably, the perhaloolefin is at least one selected from the group consisting of tetrafluoroethylene, chlorotrifluoroethylene, and hexafluoropropylene.

Preferably, the hydroxy group-containing monomer is a hydroxyalkyl vinyl ether.

Preferably, the polymer (B) further including at least one unit (b) selected from the group consisting of vinyl ester units that contain neither a hydroxy group nor an aromatic ring and alkyl vinyl ether units that do not contain a hydroxy group.

Preferably, the composition further includes a solvent.

The invention relates to a coating film which contains the polymer or which is formed from the composition.

The invention relates to a laminate including:
a base material; and
a coating film that is disposed on the base material, contains an urethane bond, and has a falling sand abrasion resistance of 80 L or greater,
the coating film satisfying that the number of squares which are not removed is 30 or greater out of 100 squares in a cross-hatch tape peel test in conformity with JIS D 0202-1988.

The invention relates to a back sheet including the coating film or the laminate.

The invention relates to a solar cell module including the laminate or the back sheet.

Advantageous Effects of Invention

The polymer of the invention having the aforementioned features is capable of providing a coating film that has good initial adhesiveness to a base material and good adhesiveness thereto after a pressure cooker test, and has excellent abrasion resistance as determined by a falling sand abrasion test.

The composition of the invention having the aforementioned features is capable of providing a coating film that has good initial adhesiveness to a base material and good adhesiveness thereto after a pressure cooker test, and has excellent abrasion resistance as determined by a falling sand abrasion test.

The coating film of the invention having the aforementioned feature has good adhesiveness to a base material and good adhesiveness thereto after a pressure cooker test, and has excellent abrasion resistance as determined by a failing sand abrasion test. In the back sheet and the solar cell module of the invention having the aforementioned features, the coating film and an additional layer other than the coating film are firmly bonded, and also, these are firmly bonded even after a pressure cooker test. Further, the back sheet and the solar cell module have excellent abrasion resistance as determined by a falling sand abrasion test.

In the laminate of the invention having the aforementioned features, the coating film has excellent abrasion resistance, excellent initial adhesiveness to the base material, and good adhesiveness thereto after a pressure cooker test, and reduces cracking of the laminate during roll processing owing to an increased strength of the coating film with a high crosslink density.

DESCRIPTION OF EMBODIMENTS

The invention will specifically be described hereinbelow.

The polymer of the invention (hereinafter, also referred to as "polymer (A)") has a feature that it has a hydroxyl value of 110 mgKOH/g or greater. The hydroxyl value is preferably 120 mgKOH/g or greater, more preferably 125 mgKOH/g or greater, still more preferably 130 mgKOH/g or greater, while preferably 180 mgKOH/g or less, more preferably 170 mgKOH/g or less, still more preferably 160 mgKOH/g or less, particularly preferably 150 mgKOH/g or less.

The hydroxyl value is calculated from the weight and the number of moles of the —OH group of the polymer (A). The number of moles of the —OH group may he determined by NMR analysis, IR measurement, titration, or elementary analysis, for example.

The polymer (A) contains a perhaloolefin unit, a vinyl ester unit that contains neither a hydroxy group nor an aromatic ring, and a hydroxy group-containing monomer unit.

The perhaloolefin constituting the perhaloolefin unit may be an olefin in which all hydrogen atoms are replaced with halogen atoms. Examples of the perhaloolefin constituting the perhaloolefin include tetrafluoroethylene (TFE), chlorotrifluoroethylene (CTFE), hexafluoropropylene (HFP), and perfluoro(alkyl vinyl ether).

In particular, the perhaloolefin is preferably at least one selected from the group consisting of TFE, CTFE, and HFP, more preferably at least one selected from the group consisting of TFE and CTFE.

The vinyl ester constituting the vinyl ester unit is preferably a vinyl carboxylate, more preferably at least one selected from the group consisting of vinyl acetate, vinyl propionate, vinyl butyrate, vinyl isobutyrate, vinyl pivalate, vinyl caproate, vinyl versatate, vinyl laurate, vinyl stearate, and vinyl cyclohexylcarboxylate, still more preferably at least one selected from the group consisting of vinyl acetate, vinyl versatate, vinyl laurate, vinyl stearate, and vinyl cyclohexylcarboxylate, particularly preferably at least one selected from the group consisting of vinyl acetate and vinyl versatate.

In order to obtain further excellent adhesiveness and abrasion resistance, the vinyl ester is preferably a vinyl carboxylate in which the carboxylic acid has a carbon number of 6 or greater, more preferably a vinyl carboxylate in which the carboxylic acid has a carbon number of 9 or greater. The upper limit of the carbon number of the carboxylic acid in the vinyl carboxylate is preferably 20, more preferably 15. In order to obtain excellent adhesiveness to an encapsulant layer, the vinyl ester is most preferably a vinyl versatate such as vinyl neononanoate or vinyl neodecanoate.

The vinyl ester contains neither a hydroxy group nor an aromatic ring. Preferably, the vinyl ester does not contain a halogen atom.

The hydroxy group-containing monomer constituting the hydroxy group-containing monomer unit is preferably at least one selected from the group consisting of hydroxyalkyl vinyl ethers, hydroxyalkyl allyl ethers, vinyl hydroxycarboxylates, allyl hydroxycarboxylates, and hydroxyalkyl (meth)acrylates, more preferably at least one selected from the group consisting of hydroxyalkyl vinyl ethers and hydroxyalkyl allyl ethers, still more preferably a hydroxyalkyl vinyl ether.

Examples of the hydroxyalkyl vinyl ethers include 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether.

Examples of the hydroxyalkyl allyl ethers include 2-hydroxyethyl allyl ether, 4-hydroxybutyl allyl ether, and glycerol monoallyl ether.

Examples of the vinyl hydroxycarboxylates include vinyl hydroxyacetate, vinyl hydroxypropanoate, vinyl hydroxybutanoate, vinyl hydroxyhexanoate, and vinyl (4-hydroxycyclohexyl)acetate.

Examples of the allyl hydroxycarboxylates include allyl hydroxyacetate, allyl hydroxypropanoate, allyl hydroxybutanoate, allyl hydroxyhexanoate, and allyl (4-hydroxycyclohexyl)acetate.

Examples of the hydroxyalkyl (meth)acrylates include 2-hydroxyethyl acrylate and 2-hydroxyethyl methacrylate.

In particular, the hydroxy group-containing monomer is still more preferably one represented by the formula (A):

$CH_2=CH-(CH_2)_l-O-(CH_2)_m-OH$ (wherein l is 0 or 1, m is an integer of 2 to 20), particularly preferably at least one monomer selected from the group consisting of 4-hydroxybutyl vinyl ether, 2-hydroxyethyl vinyl ether, 2-hydroxyethyl allyl ether, and 4-hydroxybutyl allyl ether.

The amount of the perhaloolefin unit is preferably 30 to 60 mol %, more preferably 40 to 55 mol % of all the monomer units constituting the polymer (A).

The amount of the vinyl ester unit that contains neither a hydroxy group nor an aromatic ring is preferably 1 to 40 mol %, more preferably 10 to 30 mol % of all the monomer units constituting the polymer (A).

The amount of the hydroxy group-containing monomer unit is preferably 15 to 40 mol %, more preferably 20 to 35 mol % of all the monomer units constituting the polymer (A).

Hereinafter, the amounts of the monomer units constituting the polymer may be calculated by any appropriate combination of NMR, FT-IR, elementary analysis, and X-ray fluorescence analysis depending on the types of the monomers.

The polymer (A) preferably has a number average molecular weight of 3,000 to 100,000. The number average molecular weight is more preferably 5,000 or higher, still more preferably 8,000 or higher, while more preferably 50,000 or lower, still more preferably 35,000 or lower. Too low a number average molecular weight may cause a failure in providing a coating film having excellent weather resistance, solvent resistance, and stain resistance as well as high hardness. Too high a number average molecular weight may cause an increase in viscosity of the coating, leading to difficulty in handling of the coating. The number average molecular weight may be determined by gel permeation chromatography (GPC) with tetrahydrofuran as an eluent.

The polymer (A) preferably has a glass transition temperature (second run) of 10° C. to 70° C., more preferably 15° C. to 60° C., measured using a differential scanning calorimeter (DSC). Too low a glass transition temperature may cause poor weather resistance, solvent resistance, and stain resistance and may cause a failure in providing a coating film having high hardness. Too high a glass transition temperature may cause an increase in viscosity of the coating, leading to difficulty in handling of the coating.

In order to achieve good compatibility with substances such as polyisocyanate compounds and pigments, the polymer preferably has an acid value of 0.6 to 28.8 mgKOH/g, more preferably 2 to 12 mgKOH/g.

The polymer may further contain a monomer unit other than the perhaloolefin unit, the vinyl ester unit that contains neither a hydroxy group nor an aromatic ring, and the hydroxy group-containing monomer unit. For example, the polymer (A) may contain any of the units of an aromatic ring-containing, hydroxy group-free vinyl carboxylate, a carboxy group-containing monomer, an amino group-containing monomer, a hydrolyzable silyl group-containing monomer, a hydroxy group-free alkyl vinyl ether, and a halogen atom and hydroxy group-free olefin. The amount of the monomer unit(s) may be 0 to 10 mol %, preferably 0.1 to 5 mol %, more preferably 0.5 to 3 mol % of all the monomer units constituting the polymer (A).

Examples of the aromatic ring-containing, hydroxy group-free vinyl carboxylate include vinyl benzoate and vinyl para-t-butyl benzoate.

The carboxy group-containing monomer is preferably one represented by the formula (B):

$R^{1a}R^{2a}C=CR^{3a}-(CH_2)_n-COOH$ wherein $R^{1a}$, $R^{2a}$, and $R^{3a}$ are the same as or different from each other, and each represent a hydrogen atom or a C1-C10 linear or branched alkyl group; n is an integer of 0 or greater. Examples thereof include acrylic acid, methacrylic acid, vinylacetic acid, crotonic acid, pentenoic acid, hexenoic acid, heptenoic acid, octenoic acid, nonenoic acid, decenoic acid, undecylenic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, and 22-tricosenoic acid. In particular, preferred is at least one selected from the group consisting of acrylic acid, crotonic acid, and undecylenic acid, more preferably at least one selected from the group consisting of acrylic acid and crotonic acid.

Examples of the carboxy group-containing monomer also include cinnamic acid, 3-allyloxy propionic acid, itaconic acid, itaconic acid monoester, maleic acid, maleic acid. monoester, maleic anhydride, fumaric acid, fumaric acid monoester, vinyl phthalate, vinyl pyromellitate, citraconic acid, mesaconic acid, and aconitic acid.

Examples of the amino group-containing monomer include amino vinyl ethers represented by $CH_2=CH-O-(CH_2)_x-NH_2$ (x=0 to 10), amines represented by $CH_2=CH-O-CO(CH_2)_x-NH_2$ (x=1 to 10), aminomethylstyrene, vinylamine, acrylamide, vinylacetamide, and vinylformamide.

Examples of the hydrolyzable silyl group-containing monomer include (meth)acrylic acid esters such as $CH_2$=$CHCO_2(CH_2)_3Si(OCH_3)_3$, $CH_2$=$CHCO_2(CH_2)_3Si(OC_2H_5)_3$, $CH_2$=$C(CH_3)CO_2(CH_2)_3Si(OCH_3)_3$, $CH_3$=$C(CH_3)CO_2(CH_2)_3Si(OC_2H_5)_3$, $CH_2$=$CHCO_2(CH_2)_3SiCH_3(OC_2H_5)_2$, $CH_2$=$C(CH_3)CO_2(CH_2)_3SiC_2H_5(OCH_3)_2$, $CH_2$=$C(CH_3)CO_2(CH_2)_3Si(CH_3)_2(OC_2H_5)$, $CH_2$=$C(CH_3)CO_2(CH_2)_3Si(CH_3)_2OH$, $CH_2$=$CH(CH_2)_3Si(OCOCH_3)_3$, $CH_2$=$C(CH_3)CO_2(CH_2)_3SiO_2H_5(OCOCH_3)_2$, $CH_2$=$C(CH_3)CO_2(CH_2)_3SiCH_3(N(CH_3)COCH_3)_2$, $CH_2$=$CHCO_2(CH_2)_3SiCH_3[ON(CH_3)C_2H_5]_2$, and $CH_2$=$C(CH_3)CO_2(CH_2)_3SiC_6H_5[ON(CH_3)C_2H_5]_2$; vinyl silanes such as $CH_2$=$CHSi[ON$=$C(CH_3)(C_2H_5)]_3$, $CH_2$=$CHSi(OCH_3)_3$, $CH_2$=$CHSi(OC_2H_5)_3$, $CH_2$=$CHSiCH_3(OCH_3)_2$, $CH_2$=$CHSi(OCOCH_3)_3$, $CH_2$=$CHSi(CH_3)_2(OC_2H_5)$, $CH_2$=$CHSi(CH_3)_2SiCH_3(OCH_3)_2$, $CH_2$=$CHSiC_2H_5(OCOCH_3)_2$, $CH_2$=$CHSiCH_3[ON(CH_3)C_2H_5]_2$, and vinyltrichlorosilane and partial hydrolysates of these; and vinyl ethers such as trimethoxysilylethyl vinyl ether, triethoxysilylethyl vinyl ether, trimethoxysilylbutyl vinyl ether, methyldimethoxysilylethyl vinyl ether, trimethoxysilylpropyl vinyl ether, and triethoxysilylpropyl vinyl ether.

Examples of the hydroxy group-free alkyl vinyl ether include methyl vinyl ether, ethyl vinyl ether, n-propyl vinyl ether, n-butyl vinyl ether, octadecyl vinyl ether, 2-ethylhexyl vinyl ether, cyclohexyl vinyl ether, isopropyl vinyl ether, and isobutyl vinyl ether. In particular, preferred is at least one selected from the group consisting of ethyl vinyl ether and cyclohexyl vinyl ether.

Examples of the olefin include fluorine-free olefins such as ethylene, propylene, n-butene, and isobutene.

The polymer (A) may be suitably used for the composition of the invention, the coating film of the invention, the laminate of the invention, the back sheet of the invention, and the solar cell module of the invention, for example.

The polymer (A) can be produced by solution polymerization, emulsion polymerization, suspension polymerization, or bulk polymerization, and is preferably produced by solution polymerization.

The polymer (A) is preferably produced by polymerizing monomers giving the above units through solution polymerization using an organic solvent and a polymerization initiator. The polymerization temperature is usually 0° C. to 150° C., preferably 5° C. to 95° C. The polymerization pressure is usually 0.1 to 10 MPaG (1 to 100 kgf/cm$^2$G).

Examples of the organic solvent include esters such as methyl acetate, ethyl acetate, propyl acetate, n-butyl acetate, and tert-butyl acetate; ketones such as acetone, methyl ethyl ketone, and cyclohexanone; aliphatic hydrocarbons such as hexane, cyclohexane, octane, nonane, decane, undecane, dodecane, and mineral spirits; aromatic hydrocarbons such as benzene, toluene, xylene, naphthalene, and solvent naphtha; alcohols such as methanol, ethanol, tert-butanol, isopropanol, and ethylene glycol monoalkyl ethers; cyclic ethers such as tetrahydrofuran, tetrahydropyran, and dioxane; and dimethyl sulfoxide, and mixtures thereof.

Examples of the polymerization initiator include persulfates such as ammonium persulfate and potassium persulfate (optionally in combination with any of reducing agents such as sodium hydrogen sulfite, sodium pyrosulfite, cobalt naphthenate, and dimethyl aniline); redox initiators each of which is a combination of an oxidizing agent (e.g., ammonium peroxide or potassium peroxide), a reducing agent (e.g., sodium sulfite), and a transition metal salt (e.g., iron sulfate); diacyl peroxides such as acetyl peroxide and benzoyl peroxide; dialkoxycarbonyl peroxides such as isopropoxycarbonyl peroxide and tert-butoxycarbonyl peroxide; ketone peroxides such as methyl ethyl ketone peroxide and cyclohexanone peroxide; hydroperoxides such as hydrogen peroxide, tert-butyl hydroperoxide, and cumene hydroperoxide; dialkyl peroxides such as di-tert-butyl peroxide and dicumyl peroxide; alkyl peroxy esters such as tert-butyl peroxyacetate and tert-butyl peroxypivalate; and azo compounds such as 2,2'-azobisisobutyronitrile, 2,2'-azobis(2,4-dimethylvaleronitrile), 2,2'-azobis(2-methylvaleronitrile), 2,2'-azobis(2-cyclopropylpropionitrile), 2,2'-azobis-dimethyl isobutyrate, 2,2'-azobis[2-(hydroxymethyl)propionitrile], and 4,4'-azobis(4-cyanopentenoic acid).

The composition of the invention contains a polymer (hereinafter, also referred to as "polymer (B)") and a polyisocyanate compound. The composition can be suitably used as a coating.

The polymer (B) has a feature that it has a hydroxyl value of 90 mgKOH/g or greater. The hydroxyl value is preferably 100 mgKOH/g or greater, more preferably 110 mgKOH/g or greater, while preferably 180 mgKOH/g or less, more preferably 160 mgKOH/g or less.

The hydroxyl value is calculated from the weight of the polymer (B) and the number of moles of the —OH group. The number of moles of the —OH group may be determined by NMR analysis, IR measurement, titration, or elementary analysis, for example.

The polymer (B) contains a perhaloolefin unit and a hydroxy group-containing monomer unit.

The perhaloolefin unit is the same as the perhaloolefin unit constituting the polymer (A). Also, the hydroxy group-containing monomer unit is the same as the hydroxy group-containing monomer unit constituting the polymer (A).

The amount of the perhaloolefin unit is preferably 30 to 90 mol %, more preferably 30 to 60 mol %, still more preferably 40 to 55 mol % of all the monomer units constituting the polymer (B).

The amount of the hydroxy group-containing monomer unit is preferably 10 to 70 mol %, more preferably 10 to 40 mol %, still more preferably 15 to 35 mol % of all the monomer units constituting the polymer (B).

The polymer (B) preferably further contains at least one unit (b) selected from the group consisting of vinyl ester units that contain neither a hydroxy group nor an aromatic ring and alkyl vinyl ether units that do not contain a hydroxy group, more preferably contains a vinyl ester unit that contains neither a hydroxy group nor an aromatic ring. The vinyl ester and alkyl vinyl ether are preferably free from a halogen atom.

The vinyl ester unit that contains neither a hydroxy group nor an aromatic ring is the same as the vinyl ester unit that contains neither a hydroxy group nor an aromatic ring, constituting the polymer (A). The alkyl vinyl ether unit is the same as the alkyl vinyl ether unit which constitutes the polymer (A) and does not contain a hydroxy group.

When the polymer (B) contains the unit (b), the amount of the unit (b) is preferably 1 to 35 mol %, more preferably 10 to 30 mol % of all the monomer units constituting the polymer (B).

The polymer (B) may further contain any of the units of an aromatic ring-containing, hydroxy group-free vinyl carboxylate, a carboxy group-containing monomer, an amino group-containing monomer, a hydrolyzable silyl group-containing monomer, and a halogen atom- and hydroxy group-free olefin, which are listed as the monomer unit constituting the polymer (A). The amount of the monomer unit (s) may be 0 to 10 mol %, preferably 0.1 to 5 mol %, more preferably 0.5 to 3 mol % of all the monomer units constituting the polymer (B).

The polymer (B) is preferably the polymer (A).

The polymer (B) preferably has a number average molecular weight of 3,000 to 100,000. The number average molecular weight is more preferably 5,000 or higher, still more preferably 8,000 or higher, while more preferably 50,000 or lower, still more preferably 35,000 or lower. Too low a number average molecular weight may cause poor weather resistance, solvent resistance, and stain resistance and may cause a failure in providing a coating film having high hardness. Too high a number average molecular weight may cause an increase in viscosity of the coating, leading to difficulty in handling of the coating. The number average molecular weight may be determined by gel permeation chromatography (GPC) with tetrahydrofuran as an eluent.

The polymer (B) preferably has a glass transition temperature (second run) of 10° C. to 70° C., more preferably 15° C. to 60° C., measured using a differential scanning calorimeter (DSC). Too low a glass transition temperature may cause poor weather resistance, solvent resistance, and stain resistance and may cause a failure in providing a coating film having high hardness. Too high a glass transition temperature may cause an increase in viscosity of the coating, leading to difficulty in handling of the coating.

In order to achieve good compatibility with substances such as polyisocyanate compounds and pigments, the polymer (B) preferably has an acid value of 0.6 to 28.8 mgKOH/g, more preferably 2 to 12 mgKOH/g.

The composition of the invention further contains a polyisocyanate compound, and the equivalent ratio (NCO/OH) between an isocyanate group of the polyisocyanate compound (NCO) and a hydroxy group (OH) of the polymer is smaller than 1.0.

If the equivalent ratio is smaller than 1.0, part of the hydroxy groups of the polymer (B) remains unconsumed by the reaction with the isocyanate group in cross-linking of the polymer with the polyisocyanate compound. It is expected that, if a hydroxy group remains, the crosslink density of the coating film may be insufficient and the abrasion resistance may be low. However, contrary to the expectation, the residual hydroxy group has been found to lead to a coating film having excellent abrasion resistance. This is presumably because the residual hydroxy group forms a hydrogen bonding in the coating film. In addition, the residual hydroxy group presumably contributes to adhesiveness a base material. That is, the polymer (B) having a high hydroxyl value and an equivalent ratio of smaller than 1.0 provides a coating film having good adhesiveness a base material and excellent abrasion resistance as determined by a falling sand abrasion test.

In order to obtain better adhesiveness and abrasion resistance, the equivalent ratio is preferably 0.90 or smaller, more preferably 0.85 or smaller, while preferably 0.20 or greater, more preferably 0.30 or greater.

The polyisocyanate compound is preferably at least one compound selected from the group consisting of polyisocyanate compounds derived from at least one isocyanate selected from the group consisting of xylylene diisocyanates (XDI) and bis(isocyanatomethyl)cyclohexanes (hydrogenated XDI, H6XDI), blocked isocyanate compounds based on hexamethylene diisocyanate (HDI), polyisocyanate compounds derived from hexamethylene diisocyanate (HDI), polyisocyanate compounds derived from isophorone diisocyanate (IPDI), and water dispersible polyisocyanate compounds.

In cases where the polyisocyanate compound is a polyisocyanate compound (hereinafter, also referred to as polyisocyanate compound (I)) derived from at least one isocyanate (hereinafter, also referred to as isocyanate (i)) selected from the group consisting of xylylene diisocyanates (XDI) and bis(isocyanatomethyl)cyclohexanes (hydrogenated XDI, H6XDI), the adhesiveness is further excellent.

Examples of the polyisocyanate compound (I) include an adduct prepared by addition polymerization of the isocyanate (i) and an aliphatic polyhydric alcohol having three or more hydroxy groups, an isocyanurate structure (nurate structure) including the isocyanate (i), and a biuret including the isocyanate (1).

The adduct preferably has, for example, a structure represented by the formula (1):

wherein $R^1$ represents a C3-C20 aliphatic hydrocarbon group, $R^2$ represents a phenylene group or a cyclohexylene group, and k is an integer of 3 to 20.

$R^1$ in the formula (1) is a hydrocarbon group based on the aliphatic polyhydric alcohol having three or more hydroxy groups, preferably a C3-C10 aliphatic hydrocarbon group, more preferably a C3-C6 aliphatic hydrocarbon group.

The phenylene group for $R^2$ may be a 1,2-phenylene group (o-phenylene group), a 1,3-phenylene group (m-phenylene group), or a 1,4-phenylene group (p-phenylene group). Preferred among these is a 1,3-phenylene group (m-phenylene group). All of $R^2$s in the formula (1) may represent the same phenylene group, or two or more types of phenylene groups may be present.

The cyclohexylene group for $R^2$ may be a 1,2-cyclohexylene group, a 1,3-cyclohexylene group, or a 1,4-cyclohexylene group. Preferred among these is a 1,3-cyclohexylene group. All of $R^2$s in the formula (1) may represent the same cyclohexylene group, or two or more types of cyclohexylene groups may be present.

The above-described k corresponds to the valence of the aliphatic polyhydric alcohol having three or more hydroxy groups, and is preferably an integer of 3 to 10, more preferably an integer of 3 to 6.

The isocyanurate structure has one or two or more isocyanurate rings represented by the formula (2):

in a molecule.

Examples of the isocyanurate structure include a trimer prepared by trimerization of the isocyanate, a pentamer prepared by pentamerization of the isocyanate, and a heptamer prepared by heptamerization of the isocyanate.

In particular, the isocyanurate structure is preferably a trimer represented by the formula (3)

wherein $R^2$ is the same as $R^2$ in the formula (1).

That is, the isocyanurate structure is preferably a trimer of at least one isocyanate selected from the group consisting of xylylene diisocyanates and bis(isocyanatomethyl)cyclohexanes.

The biuret is a compound having a structure represented by the formula (4):

wherein $R^2$ is the same as $R^2$ in the formula (1). The biuret can be prepared by trimerization of the isocyanate under the conditions different from those for obtaining the isocyanurate structure.

In particular, the polyisocyanate compound (I) is preferably the adduct which is specifically prepared by addition polymerization of an aliphatic polyhydric alcohol having three or more hydroxy groups and at least one isocyanate selected from the group consisting of xylylene diisocyanates and bis(isocyanatomethyl)cyclohexanes.

In cases where the polyisocyanate compound (I) is an adduct of the isocyanate (i) and an aliphatic polyhydric alcohol having three or more hydroxy groups, the aliphatic polyhydric alcohol having three or more hydroxy groups is specifically exemplified by trihydric alcohols such as glycerol, trimethylolpropane (TMP), 1,2,6-hexanetriol, trimethylolethane, 2,4-dihydroxy-3-hydroxymethylpentane, 1,1,1-tris(bishydroxymethyl)propane, and 2,2-bis(hydroxymethyl)butanol-3; tetrahydric alcohols such as pentaerythritol and diglycerol; pentahydric alcohols (pentit) such as arabite, ribitol, and xylitol; and hexahydric alcohols (hexit) such as sorbit, mannit, galactitol, and allodulcit. Particularly preferred among these are trimethylolpropane and pentaerythritol.

The xylylene diisocyanates (XDI) that may be used as constituent components of the adduct can be exemplified by 1,3-xylylene diisocyanate (m-xylylene diisocyanate), 1,2-xylylene diisocyanate (o-xylylene diisocyanate), and 1,4-xylylene diisocyanate (p-xylylene diisocyanate). Preferred among these is 1,3-xylylene diisocyanate (m-xylylene diisocyanate).

The bis(isocyanatomethyl)cyclohexanes (hydrogenated XDI, H6XDI) that may be used as constituent components of the adduct can be exemplified by 1,3-bis(isocyanatomethyl)cyclohexane, 1,2-bis(isocyanatomethyl)cyclohexane, and 1,4-bis(isocyanatomethyl)cyclohexane. Preferred among these is 1,3-bis(isocyanatomethyl)cyclohexane.

The adduct can be prepared by addition polymerization of the aliphatic polyhydric alcohol having three or more hydroxy groups and at least one isocyanate selected from the group consisting of the xylylene diisocyanates and the bis(isocyanatomethyl)cyclohexanes.

A specific example of the adduct is a compound represented by the formula (5):

(wherein $R^3$ represents a phenylene group or a cyclohexylene group), that is, a polyisocyanate compound prepared by addition polymerization of trimethylolpropane (TMP) and at least one isocyanate selected from the group consisting of the xylylene diisocyanates and the bis(isocyanatomethyl)cyclohexanes.

The phenylene group and cyclohexylene group for $R^3$ in the formula (5) are the same as those for $R^2$ in the formula (1).

The polyisocyanate compound represented by the formula (5) is commercially available as, for example, Takenate D110N (Mitsui Chemicals, Inc., XDI/TMP adduct, NCO content: 11.8%) and Takenate D120N (Mitsui Chemicals, Inc., H6XDI/TMP adduct, NCO content: 11.0%).

Specific examples of the polyisocyanate compound (1) in the form of an isocyanurate structure include Takenate D121N (Mitsui Chemicals, Inc., H6XDI nurate, NCO content: 14.0%) and Takenate D127N (Mitsui Chemicals, Inc., H6XDI nurate, trimer of H6XDI, NCO content: 13.5%).

The use of a blocked isocyanate based on hexamethylene diisocyanate (HDI) (hereinafter, also referred to simply as blocked isocyanate) as the polyisocyanate compound provides a composition having a sufficient pot life (working life).

The blocked isocyanate is preferably prepared by reacting a polyisocyanate compound derived from hexamethylene diisocyanate (hereinafter, also referred to as polyisocyanate compound (II)) with a blocking agent.

Examples of the polyisocyanate compound (II) include an adduct prepared by addition polymerization of hexamethylene diisocyanate and an aliphatic polyhydric alcohol having three or more hydroxy groups, an isocyanurate structure (nurate structure) including hexamethylene diisocyanate, and a biuret including hexamethylene diisocyanate.

The adduct preferably has, for example, a structure represented by the formula (6):

$$R^4 \text{---} (\text{OCONH} \text{---} (CH_2)_6 \text{---} NCO)_k \qquad (6)$$

wherein $R^4$ represents a C3-C20 aliphatic hydrocarbon group and k is an integer of 3 to 20.

$R^4$ in the formula (6) is a hydrocarbon group based on the aliphatic polyhydric alcohol having three or more hydroxy groups, preferably a C3-C10 aliphatic hydrocarbon group, more preferably a C3-C6 aliphatic hydrocarbon group.

The above-described k corresponds to the valence of the aliphatic polyhydric alcohol having three or more hydroxy groups, and is preferably an integer of 3 to 10, more preferably an integer of 3 to 6.

The isocyanurate structure has one or two or more isocyanurate rings represented by the formula (2)

(2)

in a molecule.

Examples of the isocyanurate structure include a trimer prepared by trimerization of the isocyanate, a pentamer prepared by pentamerization of the isocyanate, and a heptamer prepared by heptamerization of the isocyanate.

In particular, the trimer represented by the formula (7):

(7)

is preferred.

The biuret is a compound having a structure represented by the formula (8):

(8)

and can be prepared by trimerization of hexamethylene diisocyanate under the conditions different from those for obtaining the isocyanurate structure.

The blocking agent may preferably be a compound having an active hydrogen. The compound having an active hydrogen may preferably be at least one selected from the group consisting of alcohols, oximes, lactams, active methylene compounds, and pyrazole compounds.

Thus, it is preferred that the blocked isocyanate is prepared by reacting a polyisocyanate compound derived from hexamethylene diisocyanate with a blocking agent and that the blocking agent is at least one selected from the group consisting of alcohols, oximes, lactams, active methylene compounds, and pyrazole compounds.

In cases where the polyisocyanate compound (II) for obtaining the blocked isocyanate is an adduct of hexamethylene diisocyanate and an aliphatic polyhydric alcohol having three or more hydroxy groups, the aliphatic polyhydric alcohol having three or more hydroxy groups is specifically exemplified by trihydric alcohols such as glycerol, trimethylolpropane (TMP), 1, 2, 6-hexanetriol, trimethylolethane, 2,4-dihydroxy-3-hydroxymethylpentane, 1, 1, 1-tris(bishydroxymethyl)propane, and 2,2-bis(hydroxymethyl)butanol-3; tetrahydric alcohols such as pentaerythritol and diglycerol; pentahydric alcohols (pentit) such as arabite, ribitol, and xylitol; and hexahydric alcohols (hexit) such as sorbit, mannit, galactitol, and allodulcit. Particularly preferred among these are trimethylolpropane and pentaerythritol.

The adduct can be prepared by addition polymerization of hexamethylene diisocyanate and the aliphatic polyhydric alcohol having three or more hydroxy groups.

Specific examples of the compound having an active hydrogen to be reacted with the polyisocyanate compound (II) include alcohols such as methanol, ethanol, n-propanol, isopropanol, and methoxy propanol; oximes such as acetone oxime, 2-butanone oxime, and cyclohexanone oxime; lactams such as ε-caprolactam; active methylene compounds such as methyl acetoacetate and ethyl malonate; and pyrazole compounds such as 3-methylpyrazole, 3,5-dimethylpyrazole, and 3,5-diethylpyrazole. One or two or more of these may be used.

Preferred among these are active methylene compounds and oximes, and more preferred are active methylene compounds.

The blocked isocyanate is commercially available as, for example, Duranate K6000 (Asahi Kasei Chemicals Corporation, HDI-derived blocked isocyanate with an active methylene compound, Duranate TPA-B80E (Asahi Kasei Chemicals Corporation), Duranate MF-B60X (Asahi Kasei Chemicals Corporation), Duranate 17B-60PX (Asahi Kasei Chemicals Corporation), Coronate 2507 (Nippon Polyurethane Industry Co., Ltd.), Coronate 2513 (Nippon Polyurethane Industry Co., Ltd.), Coronate 2515 (Nippon Polyurethane Industry Co., Ltd.), Sumidur BL-3175 (Sumika Bayer Urethane Co., Ltd.), Luxate HC1170 (Olin Chemicals), and Luxate HC2170 (Olin Chemicals).

The polyisocyanate compound may be a polyisocyanate compound derived from hexamethylene diisocyanate (HDI) (hereinafter, also referred to as polyisocyanate compound (III)). Examples of the polyisocyanate compound (III) include the compounds listed for the polyisocyanate compound (II).

Specific examples of the polyisocyanate compound (III) include Coronate HX (Nippon Polyurethane Industry Co., Ltd., isocyanurate structure of hexamethylene diisocyanate, NCO content: 21.1%), Sumidur N3300 (Sumika Bayer Urethane Co., Ltd., isocyanurate structure of hexamethylene diisocyanate), Takenate D170N (Mitsui Chemicals, Inc., isocyanurate structure of hexamethylene diisocyanate), and Sumidur N3800 (Sumika Bayer Urethane Co., Ltd., isocyanurate structure prepolymer type of hexamethylene diisocyanate), D-370N (Mitsui Chemicals, Inc., NCO content: 25.0%), AE-700 (Asahi Kasei Corporation., NCO content: 11.9%), and D-201 (Mitsui Chemicals, Inc., NCO content: 15.8%).

The polyisocyanate compound may be a polyisocyanate compound derived from isophorone diisocyanate (IPDI) (hereinafter, also referred to as polyisocyanate compound (IV)).

Examples of the polyisocyanate compound (IV) include an adduct prepared by addition polymerization of isophorone diisocyanate and an aliphatic polyhydric alcohol having three or more hydroxy groups, an isocyanurate structure (nurate structure) including isophorone diisocyanate, and a biuret including isophorone diisocyanate.

The adduct preferably has, for example, a structure represented by the formula (9):

(9)

wherein $R^5$ represents a C3-C20 aliphatic hydrocarbon group, $R^6$ represents a group represented by the formula (10):

(10)

and k is an integer of 3 to 20.

$R^5$ in the formula (9) is a hydrocarbon group based on the aliphatic polyhydric alcohol having three or more hydroxy groups, preferably a C3-C10 aliphatic hydrocarbon group, more preferably a C3-C6 aliphatic hydrocarbon group.

The above described k corresponds to the valence of the aliphatic polyhydric alcohol having three or more hydroxy groups, and is preferably an integer of 3 to 10, more preferably an integer of 3 to 6.

The isocyanurate structure has one or more isocyanurate rings represented by the formula (2):

(2)

in a molecule.

Examples of the isocyanurate structure include a trimer prepared by trimerization of isophorone diisocyanate, a pentamer prepared by pentamerization of isophorone diisocyanate, and a heptamer prepared by heptamerization of isophorone diisocyanate.

Preferred among these is a trimer represented by the formula (11):

(11)

wherein $R^6$ is the same as $R^6$ in the formula (9).

That is, the isocyanurate structure is preferably a trimer of isophorone diisocyanate.

The biuret is a compound having a structure represented by the formula (12):

(12)

wherein $R^6$ is the same as $R^6$ in the formula (9). The biuret can be prepared by trimerization of the isophorone diisocyanate under the conditions different from those for obtaining the isocyanurate structure.

In particular, the polyisocyanate compound (IV) is preferably at least one selected from the group consisting of the adduct and the isocyanurate structure. That is, the polyisocyanate compound (IV) is preferably at least one selected from the group consisting of an adduct prepared by addition polymerization of isophorone diisocyanate and an aliphatic polyhydric alcohol having three or more hydroxy groups and an isocyanurate structure including isophorone diisocyanate.

In cases where the polyisocyanate compound (IV) is an adduct of isophorone diisocyanate and an aliphatic polyhydric alcohol having three or more hydroxy groups, the aliphatic polyhydric alcohol having three or more hydroxy groups is specifically exemplified by trihydric alcohols such as glycerol, trimethylolpropane (TMP), 1,2,6-hexanetriol, trimethylolethane, 2,4-dihydroxy-3-hydroxymethylpentane, 1,1,1-tris(bishydroxymethyl)propane, and 2,2-bis(hydroxymethyl)butanol-3; tetrahydric alcohols such as pentaerythritol and diglycerol; pentahydric alcohols (pentit) such as arabite, ribitol, and xylitol; and hexahydric alcohols (hexit) such as sorbit, mannit, galactitol, and allodulcit. Particularly preferred among these are trimethylolpropane and pentaerythritol.

The adduct to be suitably used in the invention can be prepared by addition polymerization of isophorone diisocyanate and the aliphatic polyhydric alcohol having three or more hydroxy groups.

A specific example of the adduct to he suitably used in the invention is a compound represented by the formula (13):

(13)

(wherein $R^7$ is a group represented by The formula (10)), (10)

that is, a polyisocyanate compound prepared by addition polymerization of isophorone diisocyanate and trimethylolpropane (TMP).

The polyisocyanate compound represented by the formula (10) (TMP adduct of isophorone diisocyanate) is commercially available as, for example, Takenate D140N (Mitsui Chemicals, Inc., NCO content: 11%).

The isocyanurate structure including isophorone diisocyanate is commercially available as, for example, Desmodur Z4470 (Sumika Bayer Urethane Co., Ltd., NCO content: 11%).

The polyisocyanate compound may be a water dispersible polyisocyanate compound. The water dispersible polyisocyanate compound refers to a polyisocyanate compound capable of forming an aqueous dispersion when it is stirred in an aqueous medium. Examples of the water dispersible polyisocyanate compound include (1) a mixture of a hydrophobic polyisocyanate and a hydrophilic group-containing polyisocyanate, (2) a mixture of hydrophobic polyisocyanate and a dispersant not containing an isocyanate group but containing a hydrophilic group, and (3) a hydrophilic group-containing polyisocyanate itself. The hydrophilic group in the invention refers to an anionic group, a cationic group, or a nonionic group. The water dispersible polyisocyanate compound is particularly preferably a hydrophilic group-containing polyisocyanate.

The hydrophobic polyisocyanate does not contain a hydrophilic group, and examples thereof include aliphatic diisocyanates such as 1, 4-tetramethylene diisocyanate, ethyl (2, 6-diisocyanato)hexanoate, 1, 6-hexamethylene diisocyanate, 1,12-dodecamethylene diisocyanate, and 2,2,4- or 2,4,4-trimethylhexamethylene diisocyanate; aliphatic triisocyanates such as 1,3,6-hexamethylene triisocyanate, 1,8-diisocyanato-4-isocyanatomethyloctane, and 2-isocyanato-ethyl (2,6-diisocyanato)hexanoate; alicyclic diisocyanates such as 1,3-bis(isocyanatomethyl cyclohexane), 1,4-bis(isocyanatomethyl cyclohexane), 1,3-diisocyanatocyclohexane, 1,4-diisocyanatocyclohexane, 3,5,5-trimethyl (3-isocyanatomethyl) cyclohexyl isocyanate, dicyclohexylmethane-4,4'-diisocyanate, 2,5-diisocyanatomethyl norbornane, and 2,6-diisocyanatomethyl norbornane; alicyclic triisocyanates such as 2,5-diisocyanatomethyl-2-isocynate propyl norbornane and 2,6-diisocyanatomethyl-2-isocynate propyl norbornane; aralkylene diisocyanates such as m-xylylene diisocyanate and α,α,α',α'-tetramethyl-m-xylylene diisocyanate; aromatic diisocyanates such as m- or p-phenylene diisocyanate, tolylene-2,4-diisocyanate, tolylene-2,6-diisocyanate, diphenylmethane-4,4'-diisocyanate, naphthalene-1,5-diisocyanate, diphenyl-4,4'-diisocyanate, 4,4'-diisocyanato-3,3'-dimethyl diphenyl, 3-methyl-diphenylmethane-4,4'-diisocyanate, and diphenyl ether-4,4'-diisocyanate; aromatic triisocyanates such as triphenylmethane triisocyanate and tris(isocyanatophenyl) thiophosphate; polyisocyanates having a uretdione structure that is prepared by cyclodimerization of isocyanate groups of the above listed diisocyanates or triisocyanates; polyisocyanates having an isocyanurate structure that is prepared by cyclotrimerization of isocyanate groups of the above-listed diisocyanates or triisocyanates; polyisocyanates having a biuret structure that is prepared by reacting the above listed diisocyanates or triisocyanates with water; polyisocyanates having an oxadiazinetrione structure that is prepared by reacting the above listed diisocyanates or triisocyanates with carbon dioxide; and polyisocyanates having an allophanate structure. Preferred among these are polyisocyanates having an isocyanurate structure because they provide a densely crosslinked coating film and a cured coating film with better alcohol resistance.

Examples of the hydrophilic group-containing polyisocyanate include polyethers, polyesters, polyurethanes, vinyl polymers, alkyd resins, fluororesins, and silicon resins, each containing a hydrophilic group and an isocyanate group. Preferred among these are polyethers containing a hydrophilic group and an isocyanate group or vinyl polymers containing a hydrophilic group and an isocyanate group because they are well dispersed in water. Polyethers containing a hydrophilic group and an isocyanate group are more preferred. Each of these hydrophilic group-containing polyisocyanates may be used alone or two or more of these may be used in combination.

The water dispersible polyisocyanate compounds are commercially available as, for example, Bayhydur XP 2700 (Sumika Bayer Urethane) or Bayhydur 3100 (Sumika Bayer Urethane).

In particular, the polyisocyanate compound is more preferably Takenate D120N (Mitsui Chemicals, Inc., NCO content: 11%) or Sumidur N3300 (Sumika Bayer Urethane Co., Ltd., isocyanurate structure of hexamethylene diisocyanate).

The composition of the invention preferably further contains a solvent. The solvent is preferably water or an organic solvent. Examples of the organic solvent include esters such as ethyl acetate, n-butyl acetate, tert-butyl acetate, isopropyl acetate, iso butyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethyl formamide and N,N-dimethyl acetamide; aromatic hydrocarbons such as toluene and xylene; alcohols such as propylene glycol methyl ether; hydrocarbons such as hexane and heptane; and solvent mixtures thereof. Examples thereof also include the third-class organic solvents mentioned in the Industrial Safety and Health Act and solvents equivalent thereto, which are called weak solvents. In the case of preparing a solution of the polymer in an organic solvent, the concentration of the polymer (B) has only to be 5 to 95 mass %, preferably 10 to 80 mass %.

The composition preferably further contains an additional resin other than the polymer (B). Examples of the additional resin include organic resin such as polystyrene, (meth) acrylic resin, polyester resin, alkyd resin, melamine-formaldehyde resin, polyisocyanate resin, epoxy resin, vinyl chloride resin (e.g., vinyl chloride-vinyl acetate copolymers), ketone resin, and petroleum resin, as well as chlorinated products of polyolefins such as polyethylene and polypropylene; inorganic resin such as silica gel and silicic acid; and various fluororesins other than the polymer (B) (e.g., homopolymers of tetrafluoroethylene and of chlorotrifluoroethylene, and copolymers thereof with another monomer). The amount of the additional resin is 900 parts by mass or less, preferably 500 parts by mass or less, relative to 100 parts by mass of the polymer (B). The lower limit thereof is an amount required to achieve the target properties, and depends on the type of the resin. For (meth)acrylic resin, the lower limit is usually 5 parts by mass or more, preferably 10 parts by mass or more.

The composition preferably contains a (meth)acrylic resin especially having excellent compatibility among these resins, which leads to a coating film having good gloss, high hardness, and good finish appearance.

Examples of the (meth)acrylic resin include (meth)acrylic polymers conventionally used for coatings. Particularly preferred are (i) homopolymers or copolymers of a C1-C10 alkyl ester of (meth)acrylic acid and (ii) (meth)acrylic acid ester copolymers having a curable functional group in a side chain and/or at an end of the main chain.

Examples of the (meth)acrylic polymers (i) include homopolymers and copolymers of a C1-C10 alkyl ester of (meth)acrylic acid such as n-butyl (meth)acrylate, isobutyl (meth)acrylate, and 2-ethylhexyl (meth)acrylate, and copolymers thereof with an ethylenic unsaturated monomer copolymerizable therewith.

Examples of the copolymerizable ethylenic unsaturated monomer include aromatic vinyl monomers such as aromatic group-containing (meth)acrylates, (meth)acrylates having a fluorine atom or a chlorine atom at the a position, fluoroalkyl (meth)acrylates in which an alkyl group is replaced by a fluorine atom, vinyl ethers, vinyl esters, and styrene; olefins such as ethylene, propylene, isobutylene, vinyl chloride, and vinylidene chloride; fumaric acid diesters; maleic acid diesters; and (meth)acrylonitrile.

Examples of the (meth)acrylic polymers (ii) include copolymers of a monomer that gives the (meth)acrylic polymer (i) described above and a monomer having a curable functional group. Examples of the curable functional group-containing monomer include monomers having any of a hydroxy group, a carboxy group, an epoxy group, and an amino group. Specific examples of the (meth)acrylic polymers (ii) include, but are not limited to, copolymers of a monomer having a curable functional group such as hydroxyethyl (meth)acrylate, 2-hydroxypropyl (meth)acrylate, 2-hydroxyethyl vinyl ether, (meth)acrylic acid, glycidyl (meth)acrylate, 2-aminoethyl (meth)acrylate, or 2-aminopropyl (meth)acrylate and the C1-C10 alkyl ester of (meth)acrylic acid and copolymers of any of these monomers and the copolymerizable ethylenic unsaturated monomer.

The (meth)acrylic polymer preferably has a number average molecular weight determined by GPC of 1,000 to 200,000, more preferably 2,000 to 100,000. The higher the number average molecular weight is, the lower the solvent solubility tends to be. The lower the number average molecular weight is, the more inappropriate the weather resistance tends to be.

The composition may further contain an additive. Examples of the additive include a curing accelerator, a pigment, a dispersant, a fluidity improver, a leveling agent, an antifoam, an anti-gelling agent, an ultraviolet absorber, an antioxidant, a hydrophilic agent, a flatting agent, an adhesiveness promoter, and a flame retardant.

Examples of the pigment include titanium dioxide. The titanium dioxide may be in any form, either rutile or anatase. In order to achieve good weather resistance, the rutile form is preferred. The titanium dioxide may be in the form of fine particles having a surface subjected to inorganic treatment or organic treatment, or to both inorganic and organic treatments. Examples of the inorganically treated titanium dioxide include titanium dioxide fine particles having a surface coated with alumina ($Al_2O_3$), silica ($SiO_2$), or zirconia ($ZrO_2$). Examples of the organically treated titanium dioxide include those subjected to surface treatment with a silane-coupling agent, those subjected to surface treatment with an organosiloxane, those subjected to surface treatment with an organic polyol, and those subjected to surface treatment with an alkyl amine. The titanium dioxide preferably has a basic value higher than the acid value thereof determined by titration.

Examples of commercially available products of the titanium dioxide include D-918 (Sakai Chemical Industry Co., Ltd.), R-960, R-706, and R-931 (DuPont), and PFC-105 (Ishihara Sangyo Kaisha, Ltd.).

The amount of the titanium dioxide is preferably 1 to 500 parts by mass relative to 100 parts by mass of the polymer (B). Less than 1 part by mass of the titanium dioxide may fail to block ultraviolet rays. More than 500 parts by mass thereof may suffer yellowing and deterioration due to ultraviolet rays. The amount of the titanium dioxide is more preferably 5 parts by mass or more, still more preferably 10 parts by mass or more, while more preferably 300 parts by mass or less, still more preferably 200 parts by mass or less.

The pigment may also be carbon black. The carbon black may be any one, such as any of those commonly known. In order to achieve an effect of blocking ultraviolet rays, the carbon black preferably has an average particle size of 10 to 150 nm, more preferably 20 to 100 nm. The average particle size is a value determined by electron microscopic observation.

The carbon black may agglomerate in the composition. In order to achieve an effect of blocking ultraviolet rays, the average particle size thereof in this case is preferably 50 to 1,000 nm, more preferably 100 to 700 nm, still more preferably 100 to 500 nm. The average particle size is a value determined using a laser diffraction scattering particle size distribution analyzer.

The amount of the carbon black is preferably 0.5 to 80 parts by mass relative to 100 parts by mass of the polymer (B). The carbon black in an amount within the above range can well disperse in the composition. The amount of the carbon black is more preferably 3 parts by mass or more, still more preferably 10 parts by mass or more, while more preferably 60 parts by mass or less, still more preferably 50 parts by mass or less, relative to 100 parts by mass of the polymer (B).

Examples of commercially available products of the carbon black include MA-100 (Mitsubishi Chemical Corp.) and Raven-420 (Columbian Carbon Co.).

The composition containing the pigment preferably further contains a dispersant or fluidity improver mentioned below.

Examples of the dispersant include a compound having an acid radical (other than those having an unsaturated group). Examples of the acid radical include a phosphate group, a carboxylate group, and a sulfonate group. In order to prevent agglomeration of the pigment for a long time and to achieve excellent storage stability of the composition, the acid radical is preferably at least one selected from the group consisting of a phosphate group and a carboxylate group, more preferably a phosphate group. The dispersant also contains a compound free from an unsaturated group. Since the compound is free from an unsaturated group, it is less likely to be degenerated by exposure to ultraviolet rays.

The dispersant preferably has a weight average molecular weight of 300 to 1,000,000. The dispersant having a weight average molecular weight of less than 300 may have an adsorbed resin layer with insufficient steric stabilization, failing to prevent agglomeration of the titanium dioxide. The dispersant having a weight average molecular weight exceeding 1,000,000 may cause mottle and reduced weather resistance. The weight average molecular weight is more preferably 1,000 or more and 100,000 or less. The weight average molecular weight may be determined by gel permeation chromatography (GPC) (polystyrene equivalent).

In order to achieve effective adsorption to the titanium dioxide surface, the dispersant preferably has an acid value of 3 to 2,000 mgKOH/g. The acid value is more preferably 5 mgKOH/g or higher, still more preferably 10 mgKOH/g or higher, while more preferably 1,000 mgKOH/g or lower, still more preferably 500 mgKOH/g or lower. The acid value may be determined by acid-base titration using a basic substance.

The dispersant may further contain a base. The base may be an amino group, for example.

In order to achieve good long-term storage stability of the dispersant, the dispersant preferably has a basic value of 15 mgKOH/g or lower, more preferably 5 mgKOH/g or lower. The dispersant having an acid value of 15 mgKOH/g or lower still more preferably has a basic value of lower than 5 mgKOH/g.

The dispersant is still more preferably substantially free from a base. The phrase "substantially free from a base" herein means that the measured basic value is 0.5 mgKOH/g or lower in consideration of contamination, reaction residues, measurement errors, and other relating factors. The basic value may be determined by acid-base titration using an acidic substance.

The dispersant may be any of commercially available products. Examples thereof include DISPARLON 2150, DISPARLON DA-325, DA-375, and DA-1200 (trade name, Kusumoto Chemicals, Ltd.), FLOWLEN G-700 and G-900 (trade name, Kyoeisha Chemical Co., Ltd.), SOLSPERSE 26000, 32000, 36000, 36600, 41000, and 55000 (trade name, Lubrizol Japan Ltd.), and DISPERBYK-102, 106, 110, 111, 140, 142, 145, 170, 171, 174, and 180 (trade name, BYK Japan KK). In order to achieve good long-term storage stability, preferred are DISPARLON DA-375, FLOWLEN G-700, and SOLSPERSE 36000, and more preferred is DISPARLON DA-375.

The dispersant is preferably used in combination with the titanium dioxide. The amount of the dispersant is preferably 0.1 to 100 parts by mass relative to 100 parts by mass of the titanium dioxide. Less than 0.1 parts by mass of the dispersant may fail to achieve an effect of preventing precipitation of the pigment. More than 100 parts by mass thereof tends to cause mottle and reduced weather resistance. The amount of the dispersant is more preferably 0.5 parts by mass or more, still more preferably 1.5 parts by mass or more, while more preferably 50 parts by mass or less, still more preferably 20 parts by mass or less.

The fluidity improver may be an associative acrylic polymer having an acid radical and a base. The associative acrylic polymer herein means a polymer in which polar groups contained in the acrylic polymer chains form a structure by, for example, partial adsorption due to hydrogen bonds or electric interactions in the polymer chains or between the polymer chains to achieve an effect of increasing the viscosity of the liquid.

Examples of the acrylic polymer include copolymers containing, as a main monomer, a (meth)acrylate such as methyl (meth)acrylate, ethyl (meth)acrylate, n-butyl (meth)acrylate, isobutyl (meth)acrylate, t-butyl (meth)acrylate, n-octyl (meth)acrylate, isooctyl (meth)acrylate, 2-ethylhexyl (meth)acrylate, isononyl (meth)acrylate, and cyclohexyl (meth)acrylate. The term "(meth)acrylate" herein includes both acrylate and methacrylate.

The acid radical is preferably a carboxylate group, a phosphate group, or a sulfonate group. In order to prevent agglomeration of the pigment for a long time and to maintain the storage stability of the composition, a carboxylate group is particularly preferred. The base may be an amino group.

The fluidity improver may be a reaction product between a carboxylic acid and a nitrogen-containing compound such as a hydroxylamine or hydroxyimine. The ratio between the carboxylic acid and the nitrogen-containing compound to be reacted is most preferably 1:1. Examples of the carboxylic acid include dicarboxylic acids and acid anhydrides. Examples of the hydroxylamine include primary, secondary, or tertiary alkanol amines such as monoethanol amine, propanol amine, diethanol amine, triethanol amine, and n-butyl diethanol amine, and mixtures thereof. Examples of the hydroxyimine include those having an oxazoline structure such as, specifically, Alkaterge T (trade name, Angus Chemical Co.).

The fluidity improver preferably has a weight average molecular weight of 1,000 to 1,000,000. The fluidity improver having a weight average molecular weight of less than 1,000 may insufficiently form an associative structure and fail to prevent precipitation of the titanium dioxide. The fluidity improver having a weight average molecular weight exceeding 1,000,000 may cause an excessive increase in the viscosity of the liquid, impairing the coating easiness. The weight average molecular weight is more preferably 5,000 or more and 100,000 or less. The weight average molecular weight may be determined by gel permeation chromatography (GPC) (polystyrene equivalent).

The fluidity improver may be a commercially available product. An example thereof is SOLTHIX 250 (trade name, Lubrizol Japan Ltd.).

The amount of the fluidity improver is preferably 0.05 to 20 mass % in the composition. Less than 0.05 mass % of the fluidity improver may fail to prevent precipitation of the titanium dioxide. More than 20 mass % thereof may cause separation or mottle. The amount of the fluidity improver is more preferably 0.1 mass % or more, still more preferably 0.3 mass % or more, while more preferably 10 mass % or less, still more preferably 5 mass % or less.

The flame retardant is preferably an agent generating incombustible gas in an early stage of combustion to dilute combustible gas and/or to block oxygen, thereby achieving the incombustibility.

The flame retardant is preferably at least one selected from the group consisting of compounds containing an element from Group 5B of the Periodic Table and compounds containing a halogen compound from Group 7B of the Periodic Table.

Examples of the compounds containing a halogen compound from Group 7B of the Periodic Table include aliphatic, alicyclic, or aromatic organohalogen compounds, such as bromine-based compounds, including tetrabromobisphenol A (TBA), decabromodiphenyl ether (DBDPE), octabromodiphenyl ether (OBDPE), TBA epoxy/phenoxy oligomers, and brominated crosslinked polystyrene, and chlorine-based compounds, including chlorinated paraffin and perchlorocyclopentadecane.

Examples of the compounds containing an element from Group 5B of the Periodic Table include phosphorus compounds such as phosphoric acid esters and polyphosphoric acid salts. Also preferred are antimony compounds used in combination with a halogen compound, such as antimony trioxide and antimony pentoxide. Aluminum hydroxide, magnesium hydroxide, and molybdenum trioxide may also be used.

At least one of these flame retardants may be selected and used in any amount in accordance with the type of the polymer (B), and the flame retardant is not limited thereto.

The flame retardant is specifically more preferably a phosphorus- and nitrogen-containing composition (A) or a mixture (B) of a bromine-containing compound and an antimony-containing compound. Combination of the polymer (B) with such a flame retardant leads to high incombustibility.

The phosphorus- and nitrogen-containing composition (A) is preferably a mixture of a piperazine pyrophosphate and melamine cyanurate. Examples of the piperazine pyrophosphate include those disclosed in JP S48-088791 A and in U.S. Pat. No. 4,599,375 B. One example of the melamine cyanurate is powder of a reaction product of melamine and cyanuric acid. The reaction product of melamine and cyanuric acid has many nitrogen atoms in the structure, and generates nitrogen gas when exposed to a high temperature of about 350° C. or higher, exhibiting an action of inhibiting combustion.

The phosphorus- and nitrogen-containing composition (A) preferably satisfies that the mass ratio of the melamine cyanurate to the piperazine pyrophosphate is 0.014 to 3.000. The melamine cyanurate in a ratio within the above range can improve the incombustibility and leads to good blocking performance of the coating film. The mass ratio of the melamine cyanurate to the piperazine pyrophosphate is more preferably 0.04 or higher, still more preferably 0.1 or higher, while more preferably 1.4 or lower, still more preferably 0.5 or lower, in the mixture.

Examples of commercially available products to be used as the phosphorus- and nitrogen-containing composition (A) include SCFR-200 (Sakai Chemical industry Co., Ltd.) and SCFR-110 (Sakai Chemical Industry Co., Ltd.).

The bromine-containing compound is preferably an aromatic compound having a bromine content of 65% or higher, a melting point of 200° C. or higher, and a 5% decomposition temperature of 340° C. or higher.

Specifically, the bromine-containing compound is preferably at least one selected from the group consisting of decabromodiphenyl oxide, 1,2-bis(2,3,4,5,6-pentabromophenyl)ethane, tris(tribromophenoxy)triazine, ethylene bistetrabromophthalimide, polybromophenylindan, brominated phenylene oxide, and polypentabromobenzyl acrylate.

In particular, 1,2-bis(2,3,4,5,6-pentabromophenyl)ethane represented by the following formula (a) is more preferred because it has a high melting point and does not melt or bleed out even when the coating film is heat-cured.

(a)

The bromine-containing compound may be a commercially available product, such as SAYTEX 8010 (Albemarle Corp.).

Examples of the antimony-containing compound include antimony oxides such as antimony trioxide and antimony pentoxide. In terms of acquisition at a low price, antimony trioxide is preferred.

The amount of the flame retardant is preferably 1 to 45 parts by mass relative to 100 parts by mass of the polymer (B). The flame retardant in an amount within the above range is expected to have good dispersibility in the composition and to improve the incombustibility of a coating film obtainable from the composition. Less than 1 part by mass of the flame retardant may fail to improve the incombustibility. More than 45 parts by mass thereof may have difficulty in maintaining the physical properties of the composition and the coating film. The amount of the flame retardant is more preferably 30 parts by mass or less, still more preferably 20 parts by mass or less, particularly preferably 15 parts by mass or less, relative to 100 parts by mass of the polymer (B). The amount thereof is more preferably 3 parts by mass or more, still more preferably 5 parts by mass or more.

For the flame retardant which is the phosphorus- and nitrogen-containing composition (A), the amount thereof is preferably 8 to 19 parts by mass relative to 100 parts by mass of the polymer (B). The amount of the phosphorus- and nitrogen-containing composition (A) is more preferably 9 parts by mass or more, still more preferably 10 parts by mass or more, while more preferably 17 parts by mass or less, still more preferably 15 parts by mass or less, relative to 100 parts by mass of the polymer (B).

For the flame retardant which is the mixture (B) of a bromine-containing compound and an antimony-containing compound, the amount of the bromine-containing compound is preferably 1 to 30 parts by mass and the amount of the antimony-containing compound is preferably 0.5 to 15 parts by mass each relative to 100 parts by mass of the polymer (B). The amount of the bromine-containing compound is more preferably 3 parts by mass or more, still more preferably 5 parts by mass or more, while more preferably 20 parts by mass or less, still more preferably 15 parts by mass or less, relative to 100 parts by mass of the polymer (B). The amount of the antimony compound is more preferably 1.5 parts by mass or more, still more preferably 2.5 parts by mass or more, while more preferably 10 parts by mass or less, still more preferably 7.5 parts by mass or less, relative to 100 parts by mass of the polymer (B).

Examples of the curing accelerator include organotin compounds, acidic phosphoric acid esters, reaction products of an acidic phosphoric acid ester and an amine, saturated or unsaturated polycarboxylic acids and acid anhydrides thereof, organotitanate compounds, amine compounds, and lead octylate.

Specific examples of the organotin compounds include dibutyltin dilaurate, dibutyltin maleate, dioctyltin maleate, dibutyltin diacetate, dibutyltin phthalate, tin octylate, tin naphthenate, and dibutyltin methoxide.

The acidic phosphoric acid esters are phosphoric acid esters containing a moiety represented by the following formula.

Examples thereof include organic acidic phosphoric acid esters represented by the following formula:

$(R^9-O)_b-P(=O)-(OH)_{3-b}$ wherein b is 1 or 2; and $R^9$ is an organic residue.

Specific examples thereof include those represented by the following formulas.

Examples of the organotitanate compounds include titanic acid esters such as tetrabutyl titanate, tetraisopropyl titanate, and triethanolamine titanate. Examples of commercially available products thereof include ORGATIX TC-100, TC-750, TC-760, and TA-30 (Matsumoto Fine Chemical Co., Ltd.).

Specific examples of the amine compounds include amine compounds such as butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylenediamine, triethylenediamine, guanidine, diphenylguanidine, 2,4,6-tris(dimethylaminomethyl)phenol, morpholine, N-methylmorpholine, 1,8-diazabicyclo(5.4.0)undecene-7 (DBU), carboxylic acid salts thereof, low molecular weight polyamide resins obtainable from excessive amounts of a polyamine and a polybasic acid, and reaction products of excessive amounts of a polyamine and an epoxy compound.

The curing accelerators may he used alone or in combination of two or more thereof. The amount of the curing accelerator is preferably about $1.0 \times 10^{-6}$ to $1.0 \times 10^{-2}$ parts by mass, more preferably about $5.0 \times 10^{-5}$ to $1.0 \times 10^{-3}$ parts by mass, relative to 100 parts by mass of the polymer (B).

Specific examples of the pigment include, but are not limited to, inorganic pigments such as titanium dioxide, calcium carbonate, and carbon black; and organic pigments such as phthalocyanine pigments, quinacridone pigments, and azo pigments. The upper limit of the amount of the pigment is usually about 200 parts by mass relative to 100 parts by mass of the polymer (B).

Examples of the hydrophilic agent include methyl silicate, ethyl silicate, fluoroalkyl silicate, and condensation products thereof. Examples of commercially available products thereof include ET40 and ET48 (Colcoat Co., Ltd.), MS56, MS56S, and MS57 (Mitsubishi Chemical Corp.), and GH700 and GH701 (Daikin Industries, Ltd.).

Examples of the flatting agent include silica, silica alumina, alumina, talc, calcium carbonate, and titanium dioxide. The amount of the flatting agent is preferably 1 to 100 mass % relative to the polymer (B). Examples of commercially available products thereof include Sylysia 350, Sylysia 436, Sylysia 446, Sylophobic 100, and Sylophobic 200 (Fuji Silysia Chemical Ltd.), and SYLOID ED2, SYLOID ED30, and SYLOID ED50 (W. R. Grace).

Examples of the adhesiveness promoter include various polyol additives such as polyester polyols, polycarbonate polyols, polyether polyols, and polybutadiene polyols, and silane-coupling agents. The amount of the adhesiveness promoter is preferably 0.1 to 50 mass % relative to the polymer (B). Examples of commercially available products thereof include FLEXOREZ 148, FLEXOREZ 188, and FLEXOREZ A308 (Kusumoto Chemicals, Ltd.), ETERNACOLL UH-50 and ETERNACOLL UM-90 (Ube Industries, Ltd.), Adeka Polyether P-400 and Adeka Polyol BPX-21 (Adeka Corp.), NISSO-PB GI-1000, GI-2000, and GI-3000 (Nippon Soda Co., Ltd.), PH-50 and PH-100 (Ube Industries, Ltd.), and Priplast-1838 and Priplast-3192 (Croda Japan KK).

The invention also relates to a coating film containing the polymer (A). The coating film having such a feature has good adhesiveness to a base material and good adhesiveness thereto after a pressure cooker test, and has excellent abrasion resistance as determined by a falling sand abrasion test. The coating film is preferably a cured coating film.

The invention also relates to a coating film formed from the composition. The coating film having such a feature has good adhesiveness a base material and good adhesiveness thereto after a pressure cooker test, and has excellent abrasion resistance as determined by a falling sand abrasion test. The polymer (B) contained in the composition that forms the coating film is preferably the polymer (A) in terms of adhesiveness and abrasion resistance.

The coating film can be formed by applying the composition to a base material or another material, optionally followed by drying and curing of the composition. The drying and curing can be performed at 10° C. to 300° C., usually 100° C. to 200° C., for 30 seconds to 3 days. The dried and cured composition may be aged. The aging is usually performed at 20° C. to 300° C. and completed within 1 minute to 3 days.

The coating film contains a urethane bond and has a falling sand abrasion resistance of 80 L or greater. The coating film having these features has excellent abrasion resistance, good initial adhesiveness to a base material, and good adhesiveness thereto after a pressure cooker test, and reduced cracking of the coating film during roll processing owing to an increased strength of the coating film with a high crosslink density. The coating film having these features can be suitably produced from the above-described composition. In particular, the urethane bond is formed by the reaction between an isocyanate group of the polyisocyanate compound contained in the composition and a hydroxy group of the polymer (B). The presence of a urethane bond in the coating film can be confirmed by infrared spectroscopy (IR).

The upper limit of the falling sand abrasion resistance is not limited, and may be 250 L. The falling sand abrasion resistance may be measured by the method of abrasion test for building materials and part of building construction (falling sand method) (JIS A 1452:1972).

In order to achieve good opacity, weather resistance, chemical resistance, and moisture resistance, the coating film preferably has a thickness of 5 μm or greater. The thickness is more preferably 7 μm or greater, still more preferably 10 μm or greater. Too thick a coating film may fail to give an effect of weight reduction. Thus, the upper limit of the thickness is preferably about 1,000 μm, more preferably about 100 μm. The thickness is particularly preferably 10 to 40 μm.

The coating film may be disposed on various base materials. A primer layer may be disposed between the base material and the coating film. Still, since the coating film has excellent adhesiveness, the base material and the coating film may be bonded directly with sufficient adhesion strength. The laminate including the coating film and the base material is also a preferred embodiment of the invention.

Examples of a material of the base material include metal, ceramics, resin, and glass. The base material may be a water-impermeable sheet described below.

Examples of the metal include iron; stainless steel such as SUS 304, SUS 316L, and SUS 403; aluminum; and plated steel sheets, such as zinc-plated or aluminum-plated steel sheets. Examples of the ceramic include earthenware, porcelain, alumina materials, zirconia materials, and silicon oxide materials. Examples of the resin include polyethylene terephthalate resin, polycarbonate resin, silicone resin, fluorosilicone resin, polyimide resin, polyimide-imide resin, polyimide resin, polyester resin, epoxy resin, polyphenylene sulfide resin, phenol resin, acrylic resin, and polyether sulfone resin. The coating film containing the polymer of the invention, the coating film obtained from the composition of the invention, and the coating film of the invention also have good initial adhesiveness to a base material made of silicone resin, and have good adhesiveness thereto after a pressure cooker test.

The invention also relates to a laminate including a base material and a coating film that is disposed on the base material, contains an urethane bond, and has a falling sand abrasion resistance of 80 L or greater. The coating film satisfies that the number of squares which are not removed is 30 or greater out of 100 squares in a cross-hatch tape peel test in conformity with JIS D 0202-1988.

The laminate of the invention having these features has excellent abrasion resistance, excellent initial adhesiveness to a base material, and good adhesiveness thereto after a pressure cooker test, and reduces cracking of the coating film during roll processing owing to an increased strength of the coating film with a high crosslink density. The coating film can be suitably produced from the above-described composition. In particular, the urethane bond is formed by the reaction between an isocyanate group of the polyisocyanate compound contained in the composition and a hydroxy group of the polymer (B). The presence of a urethane bond in the coating film can be confirmed by infrared spectroscopy (IR).

The number of squares which are not removed is preferably 50 or greater, more preferably 70 or greater, still more preferably 90 or greater, particularly preferably 100.

The coating film is preferably disposed directly on the base material.

Also, the laminate preferably satisfies that the number of squares which are not removed is 30 or greater out of 100 squares in a pressure cooker test in which the laminate is allowed to stand at a temperature of 121° C., a humidity of 100% RH, and a pressure of 2 atm for 60 hours, and a subsequent cross-hatch tape peel test. The number of squares which are not removed is preferably 50 or greater, more preferably 70 or greater, still more preferably 90 or greater, particularly preferably 100.

Examples of the material of the base material in the laminate include the above-described materials. In particular, preferred is polyethylene terephthalate resin.

The laminate is suitably used as a back sheet of a solar cell module.

The invention also relates to a back sheet including the coating film. The back sheet is suitably used as a back sheet for a solar cell module to protect the back of solar cell module. The solar cell module usually includes a surface layer, a solar cell, an encapsulant layer for encapsulating a solar cell, and a back sheet. It is known that the back sheet needs to have properties such as mechanical strength, weather resistance, waterproof, moisture proof, and electrical insulation. The back sheet of the invention solves a problem achieving abrasion resistance as determined by a falling sand abrasion test, and the problem is solved by the presence of the coating film.

The back sheet preferably further includes a water-impermeable sheet. The water-impermeable sheet is a layer disposed so as to prevent permeation of moisture to the encapsulant and the solar cell, and may be formed from any material substantially preventing permeation of water. From the viewpoints of factors such as weight, price, and flexibility, polyethylene terephthalate (PET) sheets, $SiO_x$-deposited PET sheets, and metal thin sheets of aluminum or stainless steel are often used. In particular, very often used are PET sheets. The thickness thereof is usually about 50 to 250 μm. $SiO_x$-deposited PET sheets are often used for cases requiring especially moisture proofing. The thickness thereof is usually about 10 to 20 μm.

The coating film is disposed on at least one side of the water-impermeable sheet. The coating film may be disposed on only one side of the water-impermeable sheet, or may be disposed on both sides thereof. The water-impermeable sheet and the coating film may be bonded either directly or with a different layer in between. Still, they are preferably bonded to each other directly. The different layer may be a primer layer, for example.

The primer layer is formed using a conventionally known coating for primers by a common method.

Representative examples of the coating for primers include epoxy resin, urethane resin, acrylic resin, silicone resin, and polyester resin.

In order to achieve good opacity, weather resistance, chemical resistance, and moisture resistance, the coating film preferably has a thickness of 5 μm or greater. The thickness is more preferably 7 μm or greater, still more preferably 10 μm or greater. Too thick a coating film may fail to give an effect of weight reduction. Thus, the upper limit of the thickness is preferably about 1,000 μm, more preferably about 100 μm. The thickness is particularly preferably 10 to 40 μm.

In order to improve the adhesiveness to the coating film, the water-impermeable sheet may be subjected to a conventionally known surface treatment. Examples of the surface treatment include corona discharge treatment, plasma discharge treatment, and chemical conversion coating, and, for metal sheets, blast treatment.

The back sheet may be used in the state of adhering to an encapsulant layer of a solar cell module. For the back sheet including the coating film on only one side of the water-impermeable sheet, the water-impermeable sheet and the encapsulant layer may be bonded to each other, or the coating film and the encapsulant layer may be bonded to each other. Preferably, the coating film and the encapsulant layer are bonded to each other because the coating film exhibits excellent adhesiveness to the water-impermeable sheet and excellent adhesiveness to the encapsulant layer. Also, preferably, the coating film is placed on the outermost surface of the solar cell module because the coating film has excellent weather resistance. Accordingly, the back sheet preferably includes the coating film on each side of the water-impermeable sheet.

The encapsulant layer is formed from an encapsulant and encapsulates the solar cell therein. Examples of the encapsulant include ethylene/vinyl acetate copolymers (EVA), polyvinyl butyral (PVB), silicone resin, epoxy resin, and acrylic resin. Preferred is EVA.

A solar cell module including the laminate or the back sheet is also one aspect of the invention.

Figure 1:
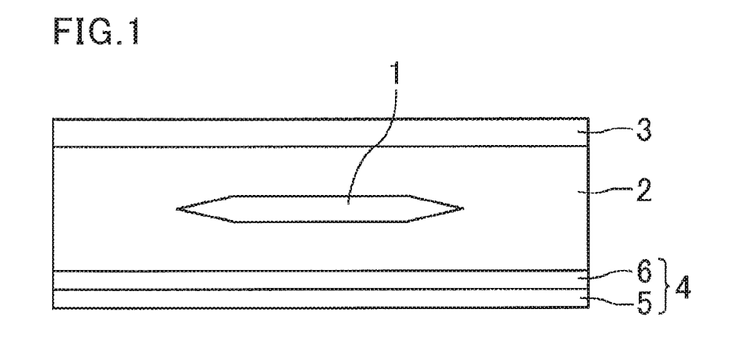
FIG. 1 is a schematic cross-sectional view of a first structure of a solar cell module.
Figure 2:
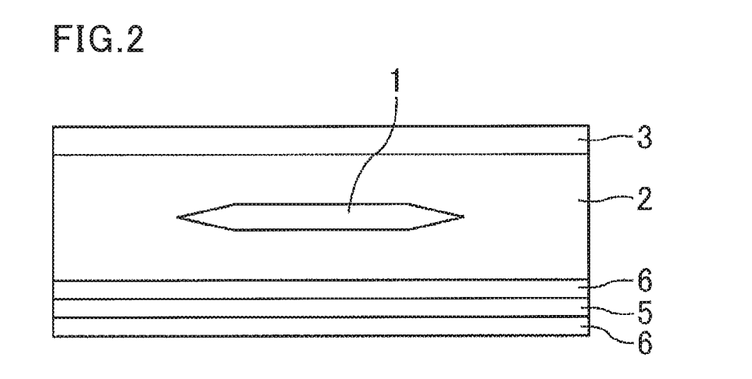
FIG. 2 is a schematic cross-sectional view of a second structure of a solar cell module.
Figure 3:
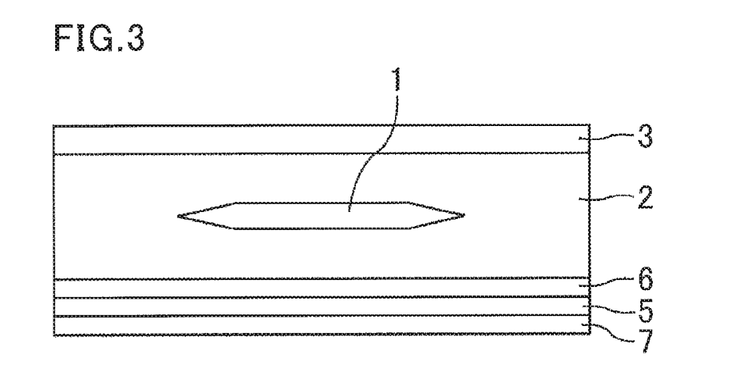
FIG. 3 is a schematic cross-sectional view of a third structure of a solar cell module.

Examples of a preferred structure of the solar cell module include those illustrated in FIGS. 1 to 3.

In a first structure illustrated in FIG. 1, a solar cell 1 is encapsulated in an encapsulant layer 2, and the encapsulant layer 2 is disposed between a surface layer 3 and a back sheet 4. The back sheet 4 includes a water-impermeable sheet 5 and a coating film 6. In this first structure, the coating film 6 is disposed only on the side of the encapsulant layer 2. In FIGS. 1 to 3, the coating film 6 is the aforementioned coating film.

The encapsulant layer 2 is formed from an ethylene/vinyl acetate copolymer (EVA), polyvinyl butyral (PVB), silicone resin, epoxy resin, or acrylic resin, for example.

The surface layer 3 is usually a glass plate, and may be a flexible material such as a resin sheet.

A second structure illustrated in FIG. 2 is a trilayer structure including the coating film 6 disposed on each side of the water-impermeable sheet 5.

Although the back sheet of this second structure has an increased thickness, this structure has both the adhesiveness owing to the coating film 6 on the side of the encapsulant layer 2 and the weather resistance owing to the coating film 6 on the side opposite to the encapsulant layer 2.

The back sheet having a trilayer structure may include a water-impermeable sheet, the aforementioned coating film on one side of the water-impermeable sheet, and a coating film different from the aforementioned coating film, a fluoropolymer sheet, a polyester sheet, or a coating film formed from a polyester coating (a different sheet or coating film) on the other side thereof.

A third structure illustrated in FIG. 3 is a structure including the water-impermeable sheet 5, the coating film 6 on the side of the encapsulant layer 2 of the water-impermeable sheet 5, and a different coating film 7 on the side opposite to the encapsulant layer 2.

The material of the coating film 7 may be a coating film different from the aforementioned coating film, a fluoropolymer sheet, a polyester sheet, or a coating film formed from a polyester coating.

In order to further improve the adhesiveness between the coating film and the encapsulant layer, the coating film may be subjected to a conventionally known surface treatment. Examples of the surface treatment include corona discharge treatment, plasma discharge treatment, chemical conversion coating, and blast treatment.

Examples of the coating film different from the aforementioned coating film include a coating film formed from a coating containing polyvinylidene fluoride (PVdF) mixed with a tetraalkoxysilane or a partially hydrolyzed product thereof disclosed in JP 2004-214342 A, a coating film formed from a coating mixture of a VdF/TFE/CTFE copolymer and an alkoxysilane unit-containing acrylic resin, a coating film formed from a coating mixture of a VdF/TFE/HFP copolymer and a hydroxy-containing acrylic resin, and a coating film formed from a coating containing a VdF/HFP copolymer mixed with an aminosilane-coupling agent. In order to achieve good opacity, weather resistance, chemical resistance, and moisture resistance, the coating film preferably usually has a thickness of 5 to 300 μm. The thickness is more preferably 10 to 100 μm, still more preferably 10 to 50 μm. Also, in this case, a different layer such as a primer layer may be disposed.

Examples of the fluoropolymer sheet include fluoropolymer sheets used in current back sheets, such as PVdF sheets, polyvinyl fluoride (PVF) sheets, PCTFE sheets, TFE/HFP/ethylene copolymer sheets, TFE/HFP copolymer (FEP) sheets, TFE/perfluoro(alkyl vinyl ether) (PAVE) copolymer (PFA) sheets, ethylene/TFE copolymer (ETFE) sheets, and ethylene/CTFE copolymer (ECTFE) sheets. In order to achieve good weather resistance, the thickness is preferably usually 5 to 300 μm. The thickness is more preferably 10 to 100 μm, still more preferably 10 to 50 μm.

The polyester sheet may be one as it is used in conventional back sheets, and can be bonded to the water-impermeable sheet 5 using an acrylic adhesive, urethane adhesive, epoxy adhesive, or polyester adhesive, for example. In order to achieve good weather resistance, low cost, and good transparency, the polyester sheet preferably usually has a thickness of 5 to 300 μm. The thickness is more preferably 10 to 100 μm, still more preferably 10 to 50 μm.

Examples of the polyester coating include those containing a saturated polyester resin formed from a polycarboxylic acid and a polyhydric alcohol, and those containing an unsaturated polyester resin formed from a maleic or fumaric anhydride and a glycol. The polyester coating can form a coating film by, for example, roll coating, curtain coating, spray coating, die coating, or other coating technique. In order to achieve good opacity, weather resistance, chemical resistance, and moisture resistance, the coating film preferably has a thickness of 5 to 300 μm. The thickness is more preferably 10 to 100 μm, still more preferably 10 to 50 μm. Also, in this case, a different layer such as a primer layer may be disposed.

EXAMPLES

The invention is described hereinbelow referring to, but not limited to, reference examples.

The parameters in the reference examples were determined by the following methods.

(1) Amounts of Respective Monomer Units Constituting Polymer

The amounts (mol %) of the respective monomer units were calculated from the fluorine content (mass %) determined by elemental analysis and the compositional analysis by $^1$H-NMR spectrum.

(2) Hydroxyl Value

The hydroxyl value was calculated from the actual amount and solid content of the hydroxy monomers used in the polymerization.

(3) Falling Sand Abrasion Resistance

The falling sand abrasion resistance was measured by the method of abrasion test for building materials and part of building construction (falling sand method) (JIS A 1452: 1972).

(4) Adhesiveness

For the respective back sheets obtained according to the following reference examples, an original coating film and a coating film subjected to a pressure cooker test (PCT, 121° C., humidity: 100% RH, 2 atm) for 60 hours were prepared and subjected to a cross-hatch tape peel test in conformity with JIS J 0202-1988. Cellophane tape ("CT24", Nichiban Co., Ltd.) was pressed onto each film with the finger pad and bonded thereto, and separated therefrom. The adhesiveness was represented by the number of squares which are not removed out of 100 squares.

(5) Weather Resistance

The weather resistance was determined using SWOM (Suga Test Instruments Co., Ltd., test time: 6000 hours) and represented by gloss retention after 6,000 hours when the initial 60° gloss was taken as 100.

Reference Example 1

A 6,000-ml stainless-steel autoclave was charged with 2,500 g of butyl acetate, 584 g of vinyl neononanoate, and 527 g of 4-hydroxybutyl vinyl ether (HBVE), and purged with nitrogen under reduced pressure. Then, 658 g of tetrafluoroethylene (TFE) was put thereinto. The contents were heated to 60.0° C. under stirring, and 30 g of a peroxide-type polymerization initiator was put thereinto to initiate polymerization. The reaction was stopped when the internal pressure of the reactor was reduced from 1.0 MPaG to 0.4 MPaG. Thus, a solution containing a polymer was obtained. The composition and hydroxyl value of the polymer are shown in Table 1.

Then, a 485.0-g portion of the solution containing the polymer obtained through the reaction (polymer content: 65 mass %), 63.0 g of titanium oxide (D918, Sakai Chemical Industry Co., Ltd.) serving as a white pigment, and 208.0 g of butyl acetate were dispersed using a pigment disperser to prepare a pigment-containing dispersion.

To a 100-part by mass portion of the dispersant was added an isocyanate curing agent (Sumidur N3300, Sumika Bayer) so that the equivalent ratio (NCO/OH) between the isocyanate group (NCO) of the isocyanate curing agent and the hydroxy group (OH) of the polymer corresponds to the equivalent ratio shown in Table 1. Thus, a composition was prepared.

A polyethylene terephthalate (PET) sheet (Lumirror S10, Toray Industries, Inc., thickness: 250 μm) was subjected to corona discharge on both sides to prepare a water-impermeable sheet. The composition was applied to one side of the sheet such that the dried coating film had a thickness of 25 μm, and then dried at 150° C. for three minutes. Thus, a laminate having a bilayer structure was prepared. In addition, the composition was applied to the other side of the sheet such that the dried coating film had a thickness of 25 μm, and then dried at 150° C. for three minutes. Thus, a back sheet laminate having a trilayer structure was prepared. For this back sheet laminate, the failing sand abrasion resistance, initial adhesiveness, adhesiveness after PCT, and weather resistance were determined. The results are shown in Table 1.

Reference Examples 2 to 11 and Comparative Reference Examples 1 to 5

Polymers, compositions, and back sheets were prepared in the same manner as in Reference Example 1. The results are shown in Table 1.

VV10: Vinyl neodecanoate
VBz: Vinyl benzoate
VAc: Vinyl acetate
EVE: Ethyl vinyl ether
HBVE: 4-Hydroxybutyl vinyl ether
HEVE: 2-Hydroxyethyl vinyl ether
AA: Acrylic acid
CA: Crotonic acid

REFERENCE SIGNS LIST

1: Solar cell
2: Encapsulant layer
3: Surface layer
4: Back sheet
5: Water-impermeable sheet
6: Coating film formed from the composition of the invention
7: Different coating film

The invention claimed is:
1. A composition comprising a polymer and a polyisocyanate compound,
the polymer comprising:
a unit of a perhaloolefin; and
a hydroxy group-containing monomer unit,

TABLE 1

| | Reference Example 1 | | Reference Example 2 | | Reference Example 3 | | Reference Example 4 | | Reference Example 5 | | Reference Example 6 | | Reference Example 7 | | Reference Example 8 | |
|---|---|---|---|---|---|---|---|---|---|---|---|---|---|---|---|---|
| Perhaloolefin unit | TFE | 49 | TFE | 49 | TFE | 48 | TFE | 48 | TFE | 51 | TFE | 51 | TFE | 53 | TFE | 53 |
| Vinyl ester unit | VV9 | 21 | VV9 | 21 | VV10 | 22 | VV10 | 22 | VV9 | 18 | VV9 | 18 | VV10 | 14 | VV10 | 14 |
| Alkyl vinyl ether unit | | | | | | | | | | | | | | | | |
| Hydroxy group-containing monomer unit | HBVE | 30 | HBVE | 30 | HBVE | 28 | HBVE | 28 | HEVE | 30 | HEVE | 30 | HEVE | 32 | HEVE | 32 |
| Aromatic ring-containing vinyl ester unit | | | | | VBz | 1 | VBz | 1 | VBz | 1 | VBz | 1 | | | | |
| Carboxy group-containing monomer unit | | | | | AA | 1 | AA | 1 | | | | | CA | 1 | CA | 1 |
| Hydroxyl value (mgKOH/g) | 137 | | 137 | | 124 | | 124 | | 150 | | 150 | | 163 | | 163 | |
| Equivalent ratio (NCO/OH) | 0.6 | | 0.5 | | 0.7 | | 0.5 | | 0.6 | | 0.4 | | 0.5 | | 0.4 | |
| Falling sand abrasion resistance | 93 L | | 90 L | | 85 L | | 85 L | | 95 L | | 95 L | | 99 L | | 99 L | |
| (Initial) Adhesion | 100/100 | | 100/100 | | 100/100 | | 100/100 | | 100/100 | | 100/100 | | 100/100 | | 100/100 | |
| Adhesion (after PCT) | 100/100 | | 100/100 | | 100/100 | | 100/100 | | 100/100 | | 100/100 | | 100/100 | | 100/100 | |
| Weather resistance | 91% | | 92% | | 91% | | 92% | | 92% | | 93% | | 92% | | 94% | |

| | Reference example 9 | | Reference Example 10 | | Reference Example 11 | | Comparative Reference Example 1 | | Comparative Reference Example 2 | | Comparative Reference Example 3 | | Comparative Reference Example 4 | | Comparative Reference Example 5 | |
|---|---|---|---|---|---|---|---|---|---|---|---|---|---|---|---|---|
| Perhaloolefin unit | TFE | 46 | CTFE | 46 | CTFE | 50 | TFE | 24 | TFE | 45 | CTFE | 50 | CTFE | 50 | TFE | 44 |
| Vinyl ester unit | VV9 | 4 | VV10 | 10 | | | VV10 | 38 | | | | | | | VV10 | 36 |
| | VAc | 26 | VAc | 19 | | | | | | | | | | | | |
| Alkyl vinyl ether unit | | | | | EVE | 15 | | | | | EVE | 15 | EVE | 27 | | |
| Hydroxy group-containing monomer unit | HBVE | 23 | HEVE | 25 | HBVE | 35 | HEVE | 27 | HBVE | 37 | HBVE | 35 | HBVE | 20 | HBVE | 15 |
| Aromatic ring-containing vinyl ester unit | | | | | | | VBz | 10 | VBz | 18 | | | | | VBz | 4 |
| Carboxy group-containing monomer unit | | | | | | | CA | 0.6 | | | | | CA | 3 | AA | 1 |
| Hydroxyl value (mg/KOH/g) | 127 | | 127 | | 179 | | 109 | | 181 | | 179 | | 109 | | 60 | |
| Equivalent ratio (NCO/OH) | 0.7 | | 0.7 | | 0.5 | | 1.1 | | 1.1 | | 1.0 | | 1.0 | | 1.0 | |
| Falling sand abrasion resistance | 112 L | | 110 L | | 93 L | | 78 L | | 98 L | | 95 L | | 79 L | | 37 L | |
| (Initial) Adhesion | 100/100 | | 100/100 | | 100/100 | | 10/100 | | 10/100 | | 10/100 | | 20/100 | | 100/100 | |
| Adhesion (after PCT) | 100/100 | | 100/100 | | 100/100 | | 0/100 | | 0/100 | | 0/100 | | 0/100 | | 100/100 | |
| Weather resistance | 93% | | 92% | | 90% | | 68% | | 73% | | 90% | | 71% | | 90% | |

Abbreviations in the Table

TFE: Tetrafluoroethylene
CTFE: Chlorotrifluoroethylene
VV9: Vinyl neononanoate the polymer having a hydroxyl value of 124-179 mgKOH/g,
the composition having an equivalent ratio between an isocyanate group of the polyisocyanate compound and a hydroxy group of the polymer of 0.4-0.7, wherein the perhaloolefin is at least one selected from the group consisting of tetrafluoroethylene and chlorotrifluoroethylene, and the hydroxy group-containing monomer is at least one selected from the group consisting of 4-hydroxybutyl vinyl ether and 2-hydroxyethyl vinyl ether.

2. The composition according to claim 1, wherein the polymer further comprises at least one unit (b) selected from the group consisting of vinyl ester units that contain neither a hydroxy group nor an aromatic ring and alkyl vinyl ether units that do not contain a hydroxy group.

3. The composition according to claim 1, further comprising a solvent.

4. A coating film which is formed from the composition according to claim 1.

5. A back sheet comprising the coating film according to claim 4.

6. A solar cell module comprising the back sheet according to claim 5.

7. A laminate comprising:
a base material; and
a coating film that is disposed on the base material, contains an urethane bond, has a falling sand abrasion resistance of 80 L or greater, and is formed from the composition according to claim 5,
the coating film satisfying that the number of squares which are not removed is 30 or greater out of 100 squares in a cross-hatch tape peel test in conformity with JIS D 0202-1988.

8. A solar cell module comprising the laminate according to claim 7.

9. A back sheet comprising the laminate according to claim 7.

* * * * *